(12) United States Patent
Brew et al.

(10) Patent No.: US 12,110,597 B2
(45) Date of Patent: Oct. 8, 2024

(54) METHODS FOR SUB-AUSTENITE TRANSFORMATION TEMPERATURE DEPOSITION OF INORGANIC PARTICLES AND ARTICLES PRODUCED BY THE SAME

(71) Applicant: CORNING INCORPORATED, Corning, NY (US)

(72) Inventors: Thomas William Brew, Corning, NY (US); Dennis Michael Brown, Elmira, NY (US); Brian James Miller, Dubois, WY (US); Obiefuna Chukwuemeka Okafor, Big Flats, NY (US)

(73) Assignee: Corning Incorporated, Corning, NY (US)

( * ) Notice: Subject to any disclaimer, the term of this patent is extended or adjusted under 35 U.S.C. 154(b) by 668 days.

(21) Appl. No.: 17/279,374

(22) PCT Filed: Sep. 20, 2019

(86) PCT No.: PCT/US2019/052102
§ 371 (c)(1),
(2) Date: Mar. 24, 2021

(87) PCT Pub. No.: WO2020/068576
PCT Pub. Date: Apr. 2, 2020

(65) Prior Publication Data
US 2021/0395896 A1 Dec. 23, 2021

Related U.S. Application Data

(60) Provisional application No. 62/738,586, filed on Sep. 28, 2018.

(51) Int. Cl.
*C23C 28/04* (2006.01)
*B21C 25/02* (2006.01)
(Continued)

(52) U.S. Cl.
CPC .......... *C23C 28/044* (2013.01); *B21C 25/025* (2013.01); *C23C 16/0272* (2013.01); *C23C 16/36* (2013.01); *C23C 28/042* (2013.01)

(58) Field of Classification Search
None
See application file for complete search history.

(56) References Cited

U.S. PATENT DOCUMENTS 5,093,151 A * 3/1992 van den Berg ......... C23C 16/32
5,205,903 A 4/1993 Suzuki et al.
(Continued)

FOREIGN PATENT DOCUMENTS

CN 101243204 A 8/2008
CN 101549381 A 10/2009
(Continued)

OTHER PUBLICATIONS

Sato—JP 2015-208845 A—IDS—MT—2 layers on metal—2015 (Year: 2015).*
(Continued)

*Primary Examiner* — John Vincent Lawler
(74) *Attorney, Agent, or Firm* — Kevin M. Able

(57) ABSTRACT

Methods of applying an inorganic material to a metal substrate that includes a metallic material having an austenite transformation temperature. The method includes depositing inorganic particles onto a surface of the metal substrate. In some embodiments, methods may include depositing inorganic particles at a deposition temperature that does not cause the metallic material to exceed the austenite transformation temperature. The inorganic particles deposited onto the surface of the metal substrate may form an abrasion-resistant coating on the surface of the metal substrate. The difference between the coefficient of thermal expansion of the metallic material and the coefficient of thermal expan- (Continued)

sion of the abrasion-resistant coating may be $10 \times 10^{-6}$/ degrees C. or less.

16 Claims, 11 Drawing Sheets

(51) Int. Cl.
*C23C 16/02* (2006.01)
*C23C 16/36* (2006.01)

(56) References Cited

U.S. PATENT DOCUMENTS

| | | | |
|---|---|---|---|
| 5,208,069 A | 5/1993 | Clark et al. | |
| 5,328,513 A | 7/1994 | Suzuki et al. | |
| 6,176,153 B1 | 1/2001 | Maier | |
| 6,302,679 B1 | 10/2001 | Seely | |
| 6,723,448 B2 | 4/2004 | Asai et al. | |
| 7,384,258 B2 | 6/2008 | Kuwahara et al. | |
| 9,297,070 B2 | 3/2016 | Auger et al. | |
| 9,764,986 B2 | 9/2017 | Liu et al. | |
| 10,811,146 B2 | 10/2020 | Lomello et al. | |
| 2002/0152603 A1* | 10/2002 | Asai | C23C 16/0281 29/527.2 |
| 2005/0238890 A1* | 10/2005 | Kubota | C23C 14/06 204/192.1 |
| 2006/0018988 A1* | 1/2006 | Kuwahara | C23C 16/26 29/445 |
| 2007/0284255 A1* | 12/2007 | Gorokhovsky | C21D 6/005 106/286.4 |
| 2008/0138504 A1 | 6/2008 | Williams | |
| 2009/0241632 A1 | 10/2009 | Young | |
| 2010/0119819 A1* | 5/2010 | Rodgers | C23C 28/42 428/332 |
| 2011/0139958 A1* | 6/2011 | Vaidyanathan | C23C 30/00 428/141 |
| 2016/0215387 A1* | 7/2016 | Liu | C23C 16/34 |
| 2017/0157829 A1* | 6/2017 | Auger | C23C 16/34 |
| 2017/0275765 A1* | 9/2017 | Stiens | C23C 16/34 |
| 2018/0001511 A1 | 1/2018 | Vaidyanathan | |

FOREIGN PATENT DOCUMENTS

| | | | | |
|---|---|---|---|---|
| CN | 107889510 A | * | 4/2018 | ............ C23C 16/24 |
| EP | 1226911 A2 | | 7/2002 | |
| EP | 3369504 A1 | * | 9/2018 | ............ B23B 27/14 |
| FR | 3056602 A1 | | 3/2018 | |
| JP | 04-236778 A | | 8/1992 | |
| JP | 2002-219705 A | | 8/2002 | |
| JP | 2012-501257 A | | 1/2012 | |
| JP | 2015/208845 | * | 11/2015 | ............ B23B 27/14 |
| JP | 2015-208845 A | | 11/2015 | |
| WO | 2008/129528 A2 | | 10/2008 | |
| WO | WO-2018060642 A1 | * | 4/2018 | ......... C23C 16/0272 |

OTHER PUBLICATIONS

Schuster—WO 2018-060642 A1—Jap. D2—MT—amorphous CVD coating—Apr. 2018 (Year: 2018).*
Crucible—422 Stainless Steel—Data sheet—acc Nov. 14, 2023 (Year: 2023).*
ASM handbook—austenitizing temp of steels—2014 (Year: 2014).*
Lei—CN 107889510 A—MT—using silanes to deposit silicon oxide onto stainless steel—Apr. 2018 (Year: 2018).*
International Search Report and Written Opinion of the International Searching Authority; PCT/US2019/052102; Mailed on Dec. 19, 2019, 9 pages; European Patent Office.
Japanese Patent Application No. 2021-517586, Office Action, dated Aug. 3, 2022, 6 pages (3 pages of English Translation and 3 pages of Original Copy); Japanese Patent Office.
Chinese Patent Application No. 201980078295.5, Office Action dated Oct. 27, 2022, 4 pages (English Translation only), Chinese Patent Office.
Lukaszkowicz et al., "Characterization and properties of PVD coatings applied to extrusion dies", Science Direct , Original Research Article Vacuum, vol. 86, Issue 12, 2012, pp. 2082-2088.
Wei et al., "Evaluating thermal expansion coefficient and density of ceramic coatings by relative method", Science Direct, Materials Letters, vol. 16, 2015, pp. 542-544.

* cited by examiner

METHODS FOR SUB-AUSTENITE TRANSFORMATION TEMPERATURE DEPOSITION OF INORGANIC PARTICLES AND ARTICLES PRODUCED BY THE SAME

This is a national stage application under 35 U.S.C. § 371 of International Application No. PCT/US2019/052102, filed Sep. 20, 2019, which claims the benefit of priority under 35 U.S.C. § 119 of U.S. Provisional Application No. 62/738,586 filed on Sep. 28, 2018, the content of which is incorporated herein by reference in its entirety.

FIELD OF THE DISCLOSURE

The present disclosure relates to coating inorganic particles on a metal substrate at or below the austenite transformation temperature of the metal substrate. In particular, the present disclosure relates to coating inorganic abrasion-resistant coatings on honeycomb extrusion dies at or below the austenite transformation temperature of a metal forming the honeycomb extrusion die.

BACKGROUND

The manufacture of certain tools, such as honeycomb extrusion dies, may include the selection of materials and manufacturing processes that affect the final properties and performance of the tool. In general, it may be desirable to select materials and processes to achieve one or more properties depending on the particular type of, or intended end-use for, the tool. These properties may include parameters such as dimensional accuracy, strength, toughness, useful lifespan, etc. For example, some honeycomb extrusion dies may be made from a steel that is provided with a wear-resistant coating to improve performance or lifespan. A continuing need exists for new materials and manufacturing processes that can be selected during the manufacture of a tool to achieve various combinations of properties for the tool.

BRIEF SUMMARY

The present disclosure is directed to methods for depositing a wear-resistant coating, such as inorganic particles, onto a surface of a metal substrate at a temperature that does not exceed the austenite transformation temperature of a metallic material of the metal substrate. In particular, the currently disclosed systems and methods are applicable to various materials, such as steels, as well as extrusion dies made from these materials, such as honeycomb extrusion dies. For some tools, a wear-resistant coating may be applied, e.g., to maintain dimensional stability of features of the tool and extend the lifespan of the tool. For example, a wear-resistant coating may be utilized on a honeycomb extrusion die to help maintain and control the dimensions of the die (e.g., width of slots defining the shape of the honeycomb extrudate) over the lifespan of the die.

Such wear-resistant coatings, which may also be called abrasion-resistant coatings, may be formed of inorganic material particles and serve to extend the life of the tools. A wear-resistant coating may be applied on a die substrate material, such as a martensitic or precipitation hardening stainless steel. However, the process for applying a wear-resistant coating may create thermal stresses in the steel due to the processing temperatures necessary to apply the coating.

For example, steels, such as martensitic steels, will begin to transform to an austenite crystal phase at a specific temperature during heating-called the austenite transformation (Ac1) temperature. A steel may complete its transformation to an austenite crystal phase at a temperature above the Ac1 temperature, called the Ac3 temperature. These temperatures may be related to factors such as material composition (e.g., the particular type of selected steel) and/or processing techniques utilized (e.g., heating rate applied to the steel).

In some embodiments, deposition process parameters may be controlled to effectively deposit inorganic particles at or below a metallic material's austenite transformation temperature. In some embodiments, the alloy composition of a metallic material may be developed to increase the austenite transformation temperature above that which inorganic particles are deposited. The stresses resulting from crystal phase changes may exceed the yield strength of the steel such that components of a tool (e.g., pins of a honeycomb extrusion die) are permanently deformed, thereby creating undesirable dimensional changes in the tool (e.g., variability in the slot width between adjacent pins of a honeycomb extrusion die).

With the change in crystal phase, the coefficient of thermal expansion (CTE) of the steel also changes. And this change in CTE can create thermal stresses on the surface of the steel at the interface between a wear-resistant coating, which may have a different CTE than the steel before and/or after the steel transforms to austenite. The stresses at the interface created by a transformation to austenite can cause deformation of pins (or other components) within the extrusion die as the steel transforms to austenite during heating. Also, stress at the interface can develop when the steel transforms from austenite to a different crystal structure (e.g., martensite) when the steel is cooled. Avoiding thermal stresses due to crystal phase changes can reduce the amount of stresses created during a deposition process and reduce negative effects created by these stresses.

Relatedly, the present disclosure is directed to methods for depositing inorganic particles such that a delta CTE (as defined herein) between a metallic material of the metal substrate does not exceed a target, desired, or preset value, such as $10 \times 10^{-6}$ degrees C. This can limit the amount of stress created at the interface between the metal substrate and the deposited inorganic particles. In some embodiments, a delta CTE at a target value (e.g., of $10 \times 10^{-6}$ degrees C. or less) can be achieved by depositing inorganic particles at a temperature that does not cause the metallic material to exceed the austenite transformation temperature of the metallic material during the deposition process. In some embodiments, the deposition temperature does not exceed the austenite transformation temperature of the metallic material. In some embodiments, the composition of a multi-layer coating formed of inorganic particles can be developed so that has a delta CTE of a target value (e.g., of $10 \times 10^{-6}$ degrees C. or less).

Some embodiments are directed to a method of applying an inorganic material to a metal substrate that comprises a metallic material that undergoes transformation to an austenitic phase at an austenite transformation temperature, the method comprising: depositing inorganic particles onto a surface of the metal substrate at a deposition temperature that does not cause the metallic material to exceed the austenite transformation temperature of the metallic material.

In some embodiments, the method according to the preceding paragraph may include the surface of the metal substrate being comprised by the metallic material.

In some embodiments, the method according to embodiments of any of the preceding paragraphs may include depositing the inorganic particles with a vapor deposition process.

In some embodiments, the method according to embodiments of any of the preceding paragraphs may include depositing the inorganic particles with a chemical vapor deposition process.

In some embodiments, the method according to embodiments of any of the preceding paragraphs may include depositing inorganic particles that include at least one of: titanium carbonitride, boron, boron-doped titanium carbonitride, aluminum titanium nitride, titanium aluminum nitride, chromium nitride, titanium nitride, and a combination thereof.

In some embodiments, the method according to embodiments of any of the preceding paragraphs may include depositing the inorganic particles onto the surface of the metal substrate in a first deposition process and a second deposition process that deposits additional inorganic particles onto the inorganic particles deposited in the first deposition process, where the second deposition process includes a deposition temperature that does not exceed the austenite transformation temperature of the metallic material of the metal substrate. In some embodiments, the additional inorganic particles are different from the inorganic particles deposited in the first deposition process.

In some embodiments, the method according to embodiments of any of the preceding paragraphs may form an abrasion-resistant coating on the surface of the metal substrate, the abrasion-resistant coating formed of the inorganic particles. In some embodiments, the abrasion-resistant coating may have a thickness in the range of 1 micron to 100 microns. In some embodiments, the abrasion-resistant coating may have a thickness in the range of 2 microns to 65 microns.

In some embodiments, the method according to embodiments of any of the preceding paragraphs may form an abrasion-resistant coating over the surface of the metal substrate, the abrasion-resistant coating formed of the inorganic particles, and depositing additional inorganic particles over the abrasion-resistant coating in one or more additional deposition processes to form a multi-layer abrasion-resistant coating, where a deposition temperature of the one or more additional deposition processes does not cause the metallic material to exceed the austenite transformation temperature of the metallic material. In some embodiments, the multi-layer coating may include a boron-doped titanium carbonitride layer. In some embodiments, the multi-layer coating may include a boron-doped titanium carbonitride layer and a titanium carbonitride layer. In some embodiments, the multi-layer coating may include a plurality of boron-doped titanium carbonitride layers and a plurality of titanium carbonitride layers. In some embodiments, the multi-layer coating may include a boron-doped titanium carbonitride layer, a titanium carbonitride layer, and a titanium nitride layer. In some embodiments, an outermost layer of the multi-layer coating may include boron-doped titanium carbonitride.

In some embodiments, the method according to embodiments of any of the preceding paragraphs may include a deposition temperature in the range of 600 degrees C. to 860 degrees C.

In some embodiments, the method according to embodiments of any of the preceding paragraphs may include a metal substrate where the metallic material is a steel In some embodiments, the method according to embodiments of any of the preceding paragraphs may include a metal substrate where the metallic material is a martensitic steel.

In some embodiments, the method according to embodiments of any of the preceding paragraphs may include a metal substrate where the metallic material is a martensitic stainless steel.

In some embodiments, the method according to embodiments of any of the preceding paragraphs may include a metal substrate where the metallic material is not a precipitation hardening martensitic stainless steel.

In some embodiments, the method according to embodiments of any of the preceding paragraphs may form an abrasion-resistant coating on the surface of the metal substrate, the abrasion-resistant coating formed of the inorganic particles, where the metallic material has a first coefficient of thermal expansion measured at T degrees C. after deposition of the abrasion-resistant coating and the abrasion-resistant coating has a second coefficient of thermal expansion measured at T degrees C. after deposition of the abrasion-resistant coating, where T is equal to one degree C. greater than the temperature at which the steel starts to transform to martensite during cooling after deposition of the abrasion-resistant coating, and where a difference between the first coefficient of thermal expansion of the metallic material and the second coefficient of thermal expansion of the abrasion-resistant coating is $10 \times 10^{-6}$/degrees C. or less. In some embodiments, the difference between the first coefficient of thermal expansion of the metallic material and the second coefficient of thermal expansion of the abrasion-resistant coating is in the range of $10 \times 10^{-7}$/degrees C. to $10 \times 10^{-6}$/degrees C.

In some embodiments, the method according to embodiments of the preceding paragraph may include further depositing additional inorganic particles onto the abrasion-resistant coating in one or more additional deposition processes to form a multi-layer abrasion-resistant coating, where a deposition temperature of the one or more additional depositions processes does not exceed the austenite transformation temperature of the metallic material of the metal substrate, where the multi-layer abrasion-resistant coating includes a boron-doped titanium carbonitride layer, and where the coefficient of thermal expansion of the multi-layer abrasion-resistant coating is defined by a sum of a fractional coefficient of thermal expansion for each layer of the multi-layer coating, the fractional coefficient of thermal expansion for each layer being calculated with the following equation: fCTE=(Tl/Tt)*CTEl, where: fCTE=the fractional coefficient of thermal expansion for a respective layer, Tl=the thickness of a respective layer, Tt=the total thickness of the multilayer coating, and CTEl=the coefficient of thermal expansion for a respective layer.

In some embodiments, the method according to embodiments of any of the preceding paragraphs may include a metal substrate that includes an extruder component. In some embodiments, the extruder component may include an extrusion die. In some embodiments, the extrusion die may include a plurality of pins and an exterior surface of one or more of the plurality of pins defines the surface of the metal substrate on which the inorganic particles are deposited.

In some embodiments, the method according to embodiments of any of the preceding paragraphs may further include performing a surface preparation of the surface of the metal substrate prior to depositing the inorganic particles onto the surface, the surface preparation including removing organic particles from the surface by reacting the organic particles with hydrochloric acid formed by flowing titanium tetrachloride gas and hydrogen gas over the surface.

In some embodiments, the method according to embodiments of any of the preceding paragraphs may further include, prior to deposition of inorganic particles, depositing a layer of titanium nitride on the surface of the metal substrate at a first temperature above the austenite transformation temperature of the metallic material of the metal substrate and cooling the layer of titanium nitride and the metal substrate to a second temperature below the martensite transformation temperature of the metallic material such that austenite formed in the metallic material during deposition of the layer of titanium nitride is transformed to martensite. In some embodiments, the second temperature may be in the range of 100 degrees C. to 400 degrees C.

In some embodiments, the method according to embodiments of any of the preceding paragraphs may include a metal substrate having a previously deposited abrasion-resistant coating deposited onto the surface, and the method may further include a surface preparation of an exterior surface of the previously deposited abrasion-resistant coating prior to deposition of the inorganic particles. In some embodiments, the surface preparation may include removing oxides from the exterior surface by flowing boron trichloride over the exterior surface. In some embodiments, the surface preparation may include removing organic particles from the exterior surface by reacting the organic particles with hydrochloric acid formed by flowing titanium tetrachloride gas and hydrogen gas over the exterior surface.

Some embodiments are directed to a coated metal substrate made by the method according to any of the preceding paragraphs.

Some embodiments are directed to a coated metal substrate including a steel body with a multi-layer abrasion-resistant coating having a plurality of titanium carbonitride layers and a plurality of boron-doped titanium carbonitride layers deposited onto a surface of the steel body, where the surface of the steel body includes a steel with a coefficient of thermal expansion of X/degrees C. measured at a temperature of T degrees C., the multi-layer abrasion-resistant coating has a coefficient of thermal expansion of Y/degrees C. measured at the temperature T, and the difference between X and Y is $1 \times 10^{-6}$/degrees C. or less. The coefficients of thermal expansion for the steel and the multi-layer abrasion-resistant coating being measured by heating the steel and the multi-layer abrasion-resistant coating to a temperature at or above the austenite transformation temperature of the steel and cooling the steel and the multi-layer abrasion-resistant coating to the temperature T, where T is equal to one degree C. greater than the temperature at which the steel starts to transform to martensite during the cooling. The coefficient of thermal expansion of the multi-layer abrasion-resistant coating being defined by a sum of a fractional coefficient of thermal expansion for each layer of the multi-layer coating, where the fractional coefficient of thermal expansion for each layer is calculated with the following equation: fCTE=(Tl/Tt)*CTEl, where: fCTE=the fractional coefficient of thermal expansion for a respective layer, Tl=the thickness of a respective layer, Tt=the total thickness of the multi-layer coating, and CTEl=the coefficient of thermal expansion for a respective layer.

In some embodiments, the coated metal substrate according to embodiments of the preceding paragraph may include a multi-layer abrasion-resistant coating having a thickness in the range of 2 microns to 65 microns.

In some embodiments, the coated metal substrate according to embodiments of either of the two preceding paragraphs may include a steel body where the steel of steel body is a martensitic stainless steel.

Some embodiments are directed to a method for making a coated metal substrate, the method including depositing a multi-layer abrasion-resistant coating having a plurality of titanium carbonitride layers and a plurality of boron-doped titanium carbonitride layers on a surface of a steel substrate in a plurality of deposition processes that each deposit a layer of the multi-layer abrasion-resistant coating, the surface of the steel substrate being composed of a steel, where a deposition temperature of each of the deposition processes is above the austenite transformation temperature of the steel. The steel having a coefficient of thermal expansion measured at a temperature T in degrees C. and the multi-layer abrasion-resistant coating having a coefficient of thermal expansion measured at the temperature T, where temperature T is one degree C. greater than the temperature at which the steel transforms from austenite to martensite during cooling after the deposition of the multi-layer abrasion-resistant coating, and where the difference between the coefficient of thermal expansion of the steel and the coefficient of thermal expansion of the multi-layer abrasion-resistant coating is $10 \times 10^{-6}$/degrees C. or less. The coefficient of thermal expansion of the multi-layer abrasion-resistant coating being defined by a sum of a fractional coefficient of thermal expansion for each layer of the multi-layer coating, where the fractional coefficient of thermal expansion for each layer is calculated with the following equation: fCTE=(Tl/Tt)*CTEl, where: fCTE=the fractional coefficient of thermal expansion for a respective layer, Tl=the thickness of a respective layer, Tt=the total thickness of the multi-layer coating, and CTEl=the coefficient of thermal expansion for a respective layer.

In some embodiments, the method according to embodiments of the preceding paragraph may include deposition processes that each include a chemical vapor deposition process.

In some embodiments, the method according to embodiments of either of the two preceding paragraphs may a steel substrate where the steel of the steel substrate is a martensitic stainless steel.

BRIEF DESCRIPTION OF THE DRAWINGS

The accompanying figures, which are incorporated herein, form part of the specification and illustrate embodiments of the present disclosure. Together with the description, the figures further serve to explain the principles of and to enable a person skilled in the relevant art(s) to make and use the disclosed embodiments. These figures are intended to be illustrative, not limiting. Although the disclosure is generally described in the context of these embodiments, it should be understood that it is not intended to limit the scope of the disclosure to these particular embodiments. In the drawings, like reference numbers indicate identical or functionally similar elements.

DETAILED DESCRIPTION

Figure 1:
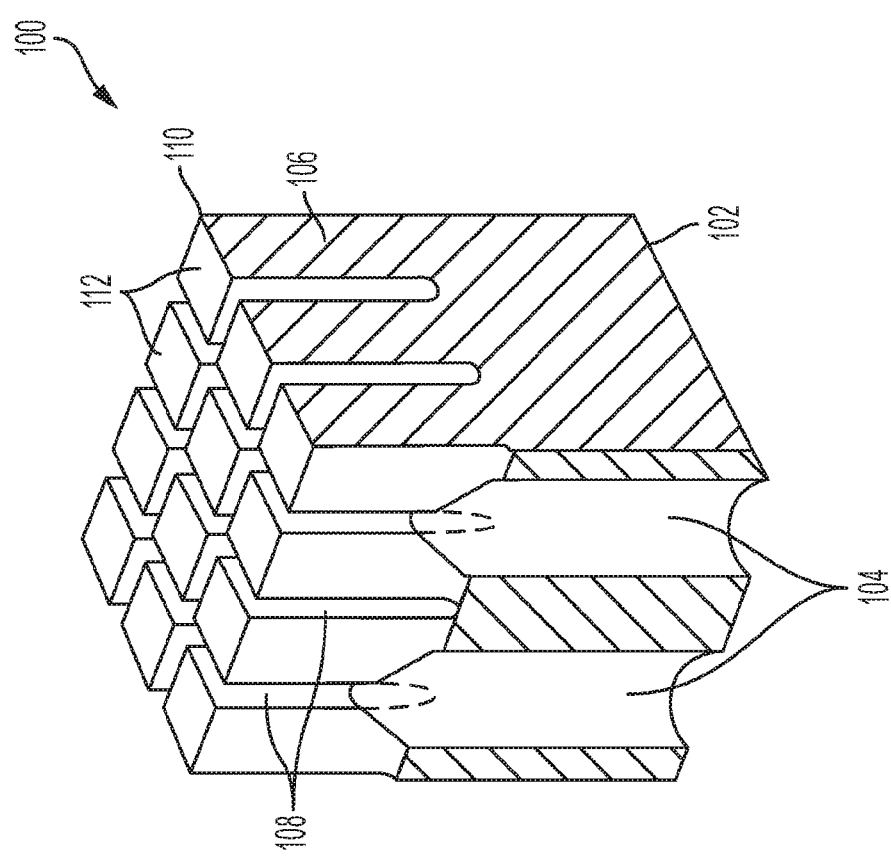
FIG. 1 illustrates a perspective view of a portion of an extrusion die according to some embodiments.

The following examples are illustrative, but not limiting, of the present disclosure. Other suitable modifications and adaptations of the variety of conditions and parameters normally encountered in the field, and which would be apparent to those skilled in the art, are within the spirit and scope of the disclosure.

Inorganic particles may be deposited to improve the wear resistance of a tool (e.g., an extrusion die). The particles may be deposited to form an abrasion-resistant coating on a surface of the tool. As used herein, "particles" deposited during a deposition process may be formed in bulk within a deposition chamber, formed directly on a surface within the deposition chamber (e.g., directly on a target substrate), or a combination thereof. Particles deposited in bulk are formed within the deposition chamber via reactions between vapor molecules, and after formation, these particles deposit on a surface. Particles formed directly on a surface are formed via the reaction of vapor molecules on a surface within the deposition chamber. Particles may be deposited on a surface to form a continuous or discontinuous film of material on the surface.

Some deposition processes (e.g., chemical vapor deposition (CVD) processes) for depositing inorganic particles require deposition temperatures above 800 degrees C., which is above the austenite transformation temperature of many conventional steels, such as stainless steels. Holding a steel above its austenite transformation temperature will result in the steel's crystal structure changing to austenite. This change to austenite induced by such high deposition temperatures changes the coefficient of thermal expansion (CTE) for a steel. For example, for a 422 martensitic stainless steel, the steel's CTE can change from about $12\times10^{-6}$/degrees C. to about $18\times10^{-6}$/degrees C. This increase in CTE results in a significant difference between the CTE of the steel and the CTE of vapor deposited inorganic particles (called "delta CTE" herein).

For purposes of the present application, the following temperatures mean and may be measured in the following ways. A deposition or surface preparation temperature is the temperature of the atmosphere within a deposition chamber during steady state deposition of inorganic particles or flow of gases used for surface preparation. For example, a deposition or surface preparation temperature may be measured using a temperature probe disposed within the deposition chamber or measuring chamber wall. An austenite transformation temperature is the temperature above which a metallic material begins to transform from a non-austenite crystal phase to an austenite crystal phase. For example, an austenite transformation temperature may be measured by dilatometry, ASTM Method E228. For the purposes of measuring the CTE of a material at a specific temperature, the temperature of the material may be the temperature measured using dilatometry, ASTM Method E228.

Some inorganic abrasion-resistant coatings have a CTE of less than that of the steel that is intended to be coated by the particles (e.g., less than about $12\times10^{-6}$/degrees C. for certain steels). Additionally, the steel's CTE will generally increase in conjunction with the formation of austenite in the steel (e.g., to $18\times10^{-6}$/degrees C.). As a result, the delta CTE between an abrasion-resistant coating and the steel will be larger due to the formation of austenite than if the austenite had not formed in the steel. For extrusion dies, this increased delta CTE is enough to cause pin deformation or bending, which leads to asymmetries in manufacturing such as hole to slot alignment or coating thickness differences, e.g., on the order of 1 to 2 microns (micrometers, μm). These thermal stresses can increase (e.g., double, triple, quadruple, etc.) the slot width variability and exceed the yield strength of the steel so that even after the coating is removed, the pins are permanently deformed and the increase in slot width variability persists even after cooling with the potential to significantly degrade web uniformity in extrudate that is produced by such die.

In accordance with the embodiments disclosed herein, reducing the degree of austenite transformation of a steel caused by a deposition process, or preventing austenite transformation entirely, can avoid an undesirably high delta CTE. As discussed herein, reducing or eliminating austenite transformation can be achieved by either or both of: (i) low temperature coating processes performed at temperatures that remain at or below the austenite transformation temperature of a steel and (ii) developing an alloy composition having a target transformation temperature. Further, an undesirably high delta CTE can be avoided by developing a coating layer with an apparent CTE at a target value or range.

Conventional CVD processes for depositing inorganic particles require temperatures that create austenite transformation within steels, such a martensitic steels and precipitation hardening steels. Low temperature CVD processes discussed herein deposit inorganic particles (e.g., TiCN, boron-doped TiCN, and/or multi-layer coatings including one or more layer of TiCN and/or boron-doped TiCN) at a temperature at or below the austenite transformation temperature of a steel. By remaining at or below this transformation temperature, the steel's CTE remains stable and does not increase the delta CTE between the steel and a deposited material. For example, it has been found that it is beneficial for the delta CTE of a conventional 422 stainless steel with a yield strength of approximately 80 ksi to remain below $10 \times 10^{-6}$/degrees C. in order to reduce or minimize the amount of pin deformation in a corresponding die made of the steel and hence preserve a low slot width variability. Minimizing the delta CTE between a deposited material and the steel to even smaller values is also preferable because any delta CTE can cause some pin deformation and hence result in an increase in slot width variability.

Low temperature deposition processes discussed herein include several parameters that achieve a stable steel CTE, suitable particle adherence, and suitable surface finish characteristics. These parameters include process temperatures, gas flowrates, and a specific process for a TiN (titanium nitride) underlayment. In some embodiments, the deposition of inorganic particles (e.g., TiCN (titanium carbonitride), boron-doped TiCN, and/or multi-layer coatings comprising one or more layers of TiCN and/or boron-doped TiCN) according to embodiments discussed herein may be achieved at a maximum deposition temperature in the range of 400 degrees C. to 900 degrees C. Low temperature deposition processes discussed herein may result in suitable deposition of inorganic particles on a steel substrate that form a high quality abrasion-resistant coating without causing austenite transformation within the steel.

In addition to low temperature processes, inorganic particle layering techniques may be used to minimize pin deformation by controlling the apparent CTE of an abrasion-resistant coating so that the delta CTE does not exceed a target value, e.g., $10 \times 10^{-6}$/degrees C. For example, in one embodiment a coating process comprises depositing multi-layer abrasion-resistant coatings with an apparent CTE that is close enough to the CTE of a metallic material such that a transformation to austenite does not result in a delta CTE above the target value, e.g., $10 \times 10^{-6}$/degrees C. The low temperature processes discussed herein can help to create abrasion-resistant coatings with relatively lower internal stresses and improved thickness uniformity, both of which can lead to decreases in slot width variation within an extrusion die.

In some embodiments, the austenite transformation temperature of a steel may be manipulated (e.g., increased) to reduce or prevent the austenite transformation during coating deposition processes and/or in use. In embodiments discussed herein, modifying the composition of a steel alloy can be used to increase the austenite transformation temperature, e.g., by as much as 100 degrees C. By increasing the austenite transformation temperature, relatively high temperature coating deposition processes can be utilized without causing significant, or any, transformation to austenite crystal phase within a steel. By avoiding significant amounts, or any, of this transformation, the delta CTE between a steel and deposited inorganic particles can be kept below a target value, e.g., below $10 \times 10^{-6}$/degrees C. In this way, keeping the delta CTE low can be used to improve dimensional stability of components of extrusion dies (such as pins of a honeycomb extrusion die) that are subjected to high temperature coating processes (i.e., reduce the amount of bending, warping, distortion or other deformation caused by the thermal stresses introduced by the high temperatures required by the deposition process.

According to embodiments discussed herein, the appropriate alloy modifications to develop a steel with an increased Ac1 temperature are derived based on empirical and computational thermodynamic calculations. These calculations demonstrate that by decreasing the carbon (C), manganese (Mn), and/or nickel (Ni) content and/or by increasing the chromium (Cr), molybdenum (Mo), vanadium (V), tungsten (W), copper (Cu), niobium (Nb), and/or silicon (Si) content in a steel (e.g., a conventional 422 stainless steel), a significant increase in the Ac1 temperature can be realized.

To achieve a desired increase in Ac1 temperature, the required compositional changes may be small. In the case of a conventional 422 stainless steel, the changes may be small enough that the steel can still be classified as a martensitic stainless steel (although technically outside the typical specification for 422). And the 422 steel will still retain desirable mechanical properties, including its ability to be hardened to 40-50 hardness on the Rockwell C scale and the ability to be tempered to 20-30 hardness on the Rockwell C scale for machinability. Increased Ac1 temperatures as discussed herein are achieved by modifying the alloy content of a steel composition, not by heat treating or working a steel alloy to manipulate the steel's Ac1 temperature. However, the modified steels discussed herein may be heat treated or worked to create desired mechanical properties.

The alloying techniques discussed herein have applicability to a wide range of steels, including high strength steels, such as stainless steels, martensitic steels, martensitic stainless steels, and precipitation hardening steels. Each of these steels are suitable materials for various high-strength tools, such as extrusion dies, cutting tools, or grinding tools.

The impact of increasing the Ac1 temperature in a steel has multiple benefits during high temperature processing treatments, such as inorganic particle deposition. These include at least the following three benefits, among others that those of ordinary skill in the art may appreciate.

First, increasing the Ac1 temperature can reduce, or eliminate, volumetric change in the steel during the phase change to austenite at the Ac1 temperature and, if applicable, a subsequent transformation to martensite between the martensite start (Ms) temperature and martensite finish (Mf) temperature during cooling. These phase transformations can increase the internal stresses of any applied hard coating or plating (e.g., an abrasion-resistant coating) for a tool (e.g., an extrusion die), which in turn can lead to geometric deformation. Internal stresses of an applied hard coating or plating can vary within the coating or plating due to variations in the thickness of the coating or plating. In such cases, the variation of internal stress can significantly contribute variation in slot width variation within an extrusion die.

Second, increasing the Ac1 temperature can reduce the CTE of a steel during high temperature processing by as much as about 40%. For example, a CTE for a martensitic stainless steel below the Ac1 temperature may be about $11.5 \times 10^{-6}$/degrees C. while, above the Ac1 temperature and to the Ms temperature on cooling, the CTE may be at or above $18 \times 10^{-6}$/degrees C. This reduction in the CTE can reduce dimensional changes during high temperature processing and also reduce stresses in the steel and/or an abrasion-resistant coating after application of the abrasion-resistant coating.

Third, increasing the Ac1 temperature can allow inorganic particle deposition via conventional coating deposition processes without the need to change the process parameters of such coating deposition processes.

Coating at or above the Ac1 temperature in conventional coating deposition processes results in significant austenite transformation and re-transformation of the steel to martensite upon cooling. For extrusion dies, transformation to austenite and re-transformation to martensite upon cooling has to been found to cause deformation and bending of pins within an extrusion die when the inorganic particles, which have a relatively low CTE, are deposited. This transformation and re-transformation may occur multiple times during deposition of different inorganic particle types for a multi-layer abrasion-resistant coating. Also, this transformation and re-transformation may occur multiple times over the lifetime of an extrusion die when one or more abrasion-resistant coatings are re-applied. The deformation created by this transformation and re-transformation increases the slot width variability of extrusion dies and ultimately an extruded material's web thickness variation.

While various embodiments are discussed herein with reference to extrusion dies, and particularly to honeycomb extrusion dies, the CTE control, low temperature deposition processes, and alloy manipulation of a metal's austenite transformation temperature can be applied to various articles where dimensional stability is desirable and/or where reducing a delta CTE is desirable. Exemplary articles include metal articles coated with inorganic abrasion-resistant particles, such as cutting tools or grinding tools.

FIG. 1 illustrates an exemplary extrusion die 100. Extrusion die 100 includes a die body 102 provided with a plurality of feedholes 104 and an array of pins 106. Exterior surfaces of pins 106 are defined by a crisscrossing array of discharge slots 108. And a discharge face 110 of extrusion die 100 is formed by top surfaces 112 of pins 106 and top openings of discharge slots 108. Extrusion die 100 may be a honeycomb extrusion die.

As noted above, the embodiments disclosed herein can be used to increase the dimensional accuracy or stability of the components of an extrusion die (such as the pins 106 and the slots 108) during manufacture and use of the die. For example, since the spacing between the pins 106 is used in this embodiment to set the width of the slots 108, the increase in dimensional stability of the pins corresponds to a reduction in the variability in the widths of the slots (the "slot width variability"). By reducing the, the shape, dimensions, and other parameters of the extrudate produced by the extrusion die can be improved. It is to be appreciated that such an increase in dimensional accuracy and the corresponding decrease in dimensional variability is not limited to pins, slots, or slots formed by pins, but can be applied to any other feature, shape, profile, or component of a tool such as an extrusion die to improve performance, lifespan, consistency of produced parts, etc.

In some embodiments, the materials used to construct extrusion die 100 may be conventional, which are then coated according to the methods disclosed herein. Examples of conventional materials suitable for the fabrication of the major die elements include tool steels, so-called high-speed steels, martensitic steels, precipitation hardening steels, and stainless steels, such as martensitic stainless steels. In some embodiments, the materials used to construct extrusion die 100 may be modified steel alloys as discussed herein, which are then coated according to conventional deposition methods, or by the methods disclosed herein.

As used herein, a "martensitic steel" or "martensitic stainless steel" means a steel or stainless steel which can be processed so as to comprise about 90 wt % or more martensitic crystal structure at room temperature (23 degrees C.). In some embodiments, a martensitic steel or stainless steel comprises about 90 wt % or more martensitic crystal structure at room temperature, 95 wt % or more martensitic crystal structure at room temperature, 96 wt % or more martensitic crystal structure at room temperature, 97 wt % or more martensitic crystal structure at room temperature, or 98 wt % or more martensitic crystal structure at room temperature. Exemplary martensitic stainless steels include, but are not limited to, 400 series stainless steels, such as 422 stainless steels and 450 stainless steels, and precipitation hardening stainless steels, such as 17-4 PH stainless steels.

The method of manufacturing extrusion die 100 may depend in part on the designs selected for discharge slots 108, pin s 106, and the die body 102 to be assembled. For example, the construction of an extrusion die can be achieved via composite discharge section fabrication through a combination of electrical discharge machining (EDM) for the shaped feedhole extensions and wire EDM slotting for forming the slot and pin shapes can be utilized. Those of ordinary skill in the art will recognize other manufacturing techniques and combinations of manufacturing techniques that can be used to form the shapes, features, and/or components of an extrusion die.

Low Delta Coefficient of Thermal Expansion (CTE) Deposition

According to embodiments discussed herein, one or more methods may be utilized to control the delta CTE between a metallic material of an article or substrate (e.g., extrusion die 100) and the inorganic particles deposited onto a surface of the article or substrate. These methods include (i) developing deposition processes that enables inorganic particles to be formed and deposited at or below the austenite transformation temperature of the metallic material and (ii) developing a multi-layer coating formed by deposited inorganic particles that has an apparent CTE in a targeted range. In this way, the delta CTE can be kept at or below a target value, e.g., $10 \times 10^{-6}$/degrees C. In some embodiments, the delta CTE may be in the range of $10 \times 10^{-6}$/degrees C. to $10 \times 10^{-6}$/degrees C.

In some embodiments, the coefficients of thermal expansion for the metallic material and the deposited inorganic particles may be measured at a temperature of at least one degree C. higher than the temperature at which the metallic material starts to transform to martensite while cooling after deposition of an abrasion-resistant coating (or would start to transform to martensite if no austenite transformation occurred during particle deposition). Since the CTE will change as the material cools (e.g., rapidly decrease as the material transforms back to martensite from austenite), measuring the coefficient of thermal expansion at such a temperature will more accurately account for the effects that the austenite crystal phase in the metallic material has on the CTE before the austenite transforms back to martensite. In some embodiments, the coefficients of thermal expansion for the metallic material and the deposited inorganic particles may be measured at room temperature (e.g., 23 degrees C.) following a quench of the metallic material and abrasion-resistant coating that prevents the transformation of the austenite back into martensite. That is, if the material is cooled rapidly enough, the austenite crystal phase does not have sufficient time to transform back to martensite during cooling.

In practice, utilizing the methods discussed herein can reduce slot width variability by as much as 65% compared to conventional processes. Conventional coating processes have an additive effect such that the slot width variability almost linearly increases after each inorganic particle deposition process. Some coating processes according to embodiments discussed herein may not have an additive effect on the slot width variability for each coating. If coating processes according to some embodiments do have an additive effect on slot width variability, the additive effect is reduced.

This is particularly advantageous because, in some cases, multiple (e.g., as many as six or more) coating cycles may be used to deposit a suitable abrasion-resistant coating on an extrusion die. In some embodiments, a significant reduction in slot width variability compared to conventional coating processes, can be realized by coating processes as discussed herein.

In some embodiments, a method of applying an inorganic material to a metal substrate (e.g., extrusion die 100) includes depositing inorganic particles onto a surface of the metal substrate at a deposition temperature that does not exceed the austenite transformation temperature of a metallic material of the metal substrate and/or that does not cause the metallic material to exceed the austenite transformation temperature of the metallic material. In some embodiments, the maximum deposition temperature for depositing inorganic particles may be below the austenite transformation temperature of the metallic material of the metal substrate. The austenite transformation temperature of a metallic material can be determined using the phase transformation diagram for the metallic material and/or evaluating the change in CTE of the metallic material across a range of temperatures.

Figure 2:
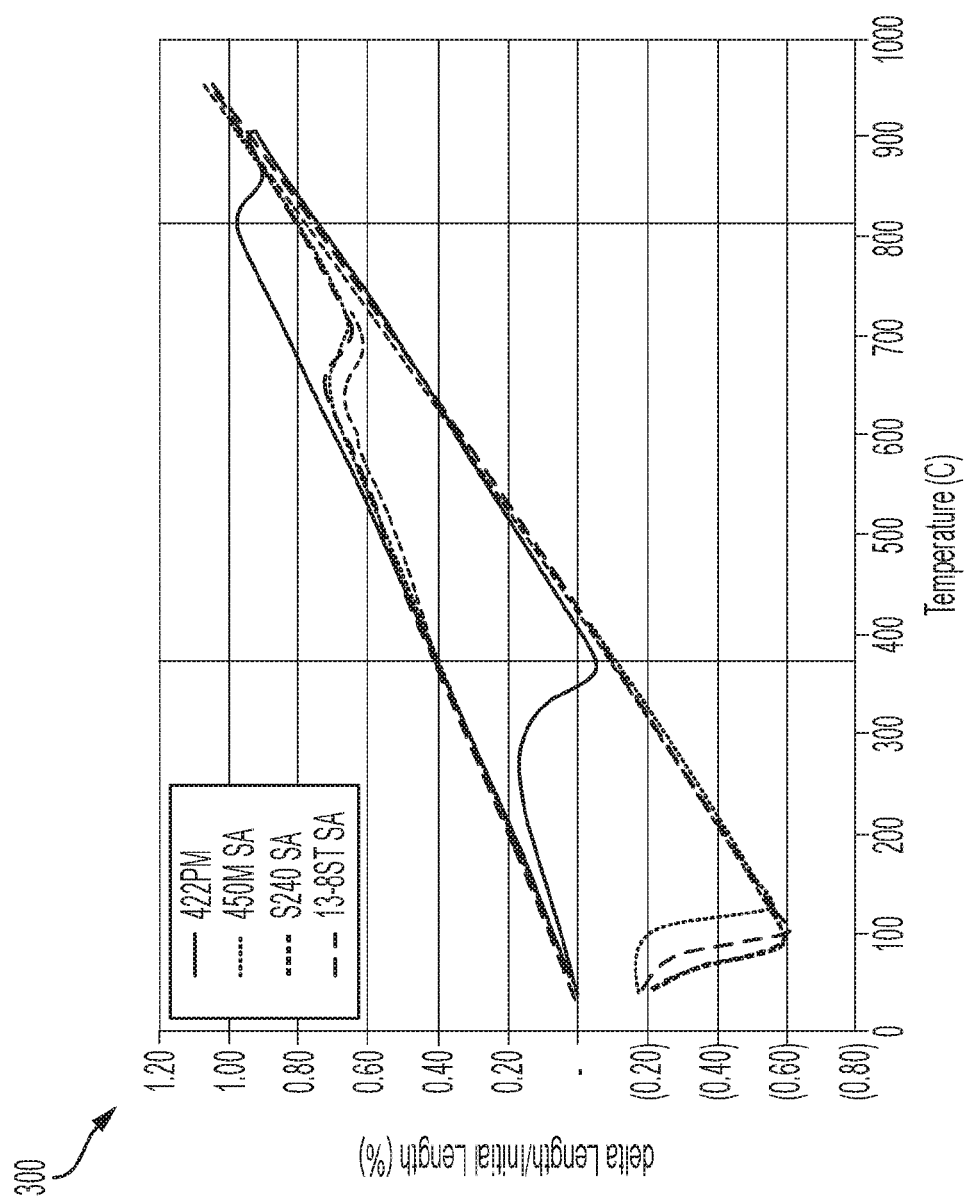
FIG. 2 is a graph of the coefficient of thermal expansion for exemplary steels across a range of temperatures during heating and cooling.

The CTE curves shown in graph 300 of FIG. 2 illustrate the expansion/contraction strain curves of several conventional extrusion die steels. "422PM" is a conventional 422 martensitic stainless steel. "450M SA" is a conventional 450 martensitic stainless steel. "S240 SA" and "13-8ST SA" are conventional martensitic precipitation hardening stainless steels. "SA" stands for solution annealed.

As shown in graph 300, all these steels have austenite transformation temperatures at or below about 805 degrees C., which may be at or below a conventional inorganic particle deposition temperature of 805 degrees C. or more. The austenite transformation temperature of the steels in graph 300 is illustrated by the significant change in the curvature of the CTE curve for each steel at a particular temperature during heating. As also shown in graph 300, the CTE curve for each of the steels significantly changes upon cooling once the steel reaches the temperature at which austenite starts to transform back to martensite. For 422PM steel, this occurs at about 400 degrees C. during cooling. For the other three steels shown, this increase in slope occurs at about 100 degrees C. during cooling.

Figure 3:
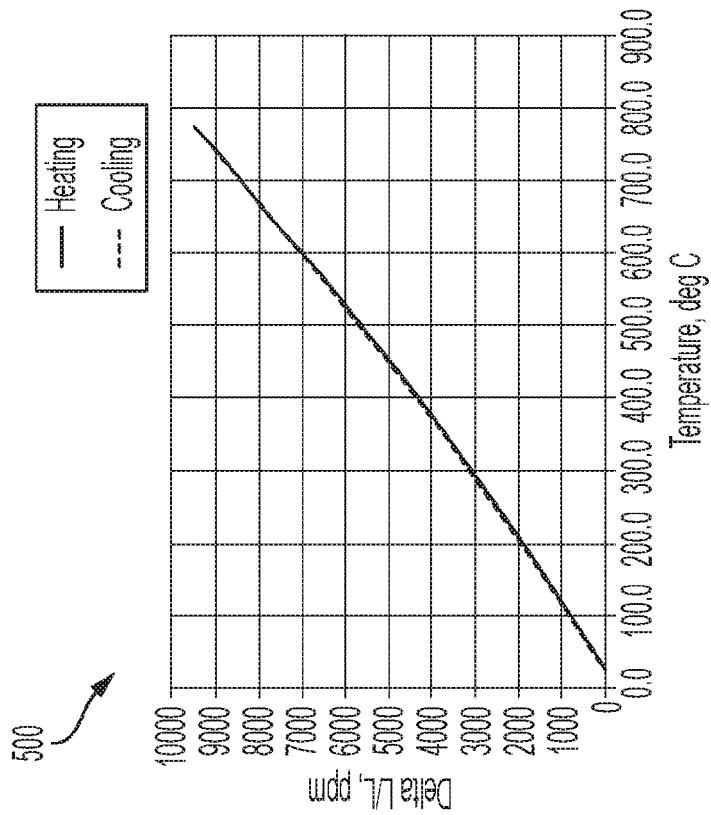
FIG. 3 is graph of the coefficient of thermal expansion across a range of temperatures for an exemplary steel during a high temperature coating process.
Figure 4:
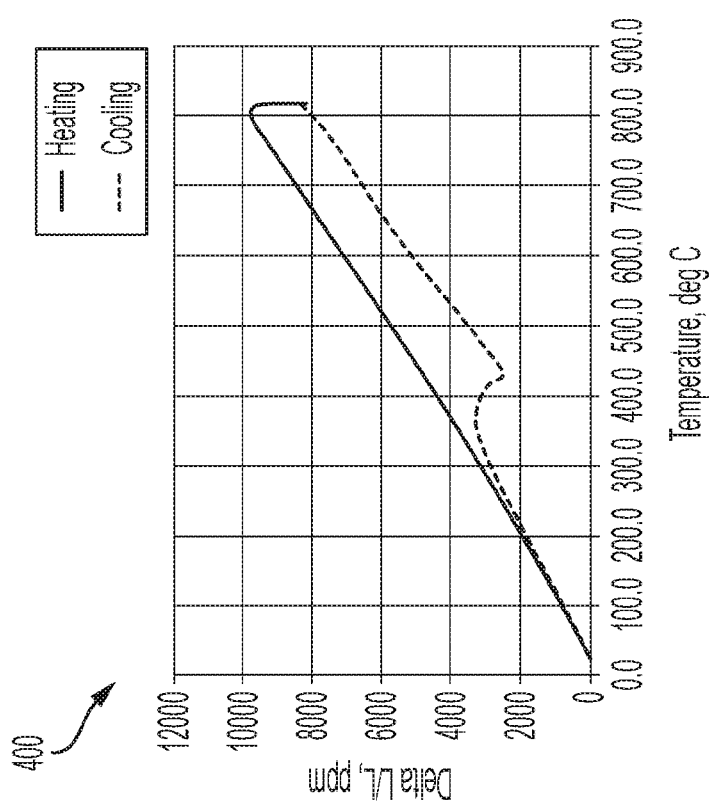
FIG. 4 is a graph of the coefficient of thermal expansion across a range of temperatures for an exemplary steel during a low temperature coating process according to some embodiments.

As illustrated in FIGS. 3 and 4, by keeping the maximum deposition temperature at or below the austenitic transformation temperature of a steel (e.g., the 805 degrees C. transformation temperature for 422PM), the CTE of the steel remains stable and at a lower value. Because of this, the delta CTE between the steel and deposited inorganic particles does not sharply increase when the steel begins transforming to austenite. FIG. 3 shows a graph 400 of thermal expansion (Delta L/L, ppm) versus temperature for a deposition process having a maximum deposition temperature that exceeds the austenite transformation of a 422PM steel. As shown in graph 400, the steel thermally expands at a generally linear rate until a temperature of about 805 degrees C., at which the thermal expansion of the steel severely changes due to the onset of austenite formation within the steel. This severe change reverses as the steel is cooled due to the steel transforming from austenite to martensite upon cooling. In contrast, as shown in graph 500, if the maximum deposition temperature remains below 805 degrees C. (e.g., about 775 degrees C. in graph 500), the steel does not experience a severe change in thermal expansion.

According to examples disclosed herein, a CVD was developed with a plurality of process parameters to obtain suitable inorganic particle formation and deposition at temperatures lower than a steel's austenite transformation temperature. Table 1 below shows a comparison of process parameters for a conventional CVD coating method for depositing TiN and boron-doped TiCN (B—TiCN) particles and a low temperature coating method of depositing TiN and B—TiCN particles according to some embodiments. To deposit TiCN particles, similar process parameters as those used for deposition of boron-doped TiCN are used, with exception that a boron source is not included. The deposition chamber pressure for both the conventional CVD coating method and the low temperature coating method may be in the range of 140 mbar (millibar) to 180 mbar for TiN deposition. The deposition chamber pressure for both the conventional CVD coating method and the low temperature coating method may be in the range of 80 mbar to 120 mbar for B—TiCN deposition.

In the low temperature example shown in Table 1, deposition of B—TiCN particles was achieved by ensuring full TiN coverage at a thickness of approximately 1 micron across a substrate's surface before commencing the B—TiCN particle deposition and by reducing the carrier gas flow ($H_2$) by about 30% compared to the conventional CVD deposition process. In some embodiments, $H_2$ carrier gas flow rate may be in the range of 20 to 40 liters per minute (LPM) including subranges. For example, in some embodiments, $H_2$ carrier gas flow rate may be 20, 22, 24, 26, 28, 30, 32, 34, 36, 38, or 40 LPM, or within any range having any two of these values as endpoints.

TABLE 1

Comparison of CVD coating methods for depositing TiN and boron-doped TiCN

| | Conventional | Low Temperature |
|---|---|---|
| During TiN Deposition | | |
| TiN coating temp (deg C.) | 820 | 850 |
| $TiCl_4$ (ml/min) | 2.0-3.0 | 2.0-3.0 |
| During B—TiCN Deposition | | |
| CVD coating temp (deg C.) | 805 | 770 |
| $H_2$ (LPM) | 50-45 | 20-40 |
| $BCl_3$ (sccm) | 280-320 | 280-320 |
| $TiCl_4$ (ml/min) | 4.0-5.0 | 4.0-5.0 |

Figure 5:
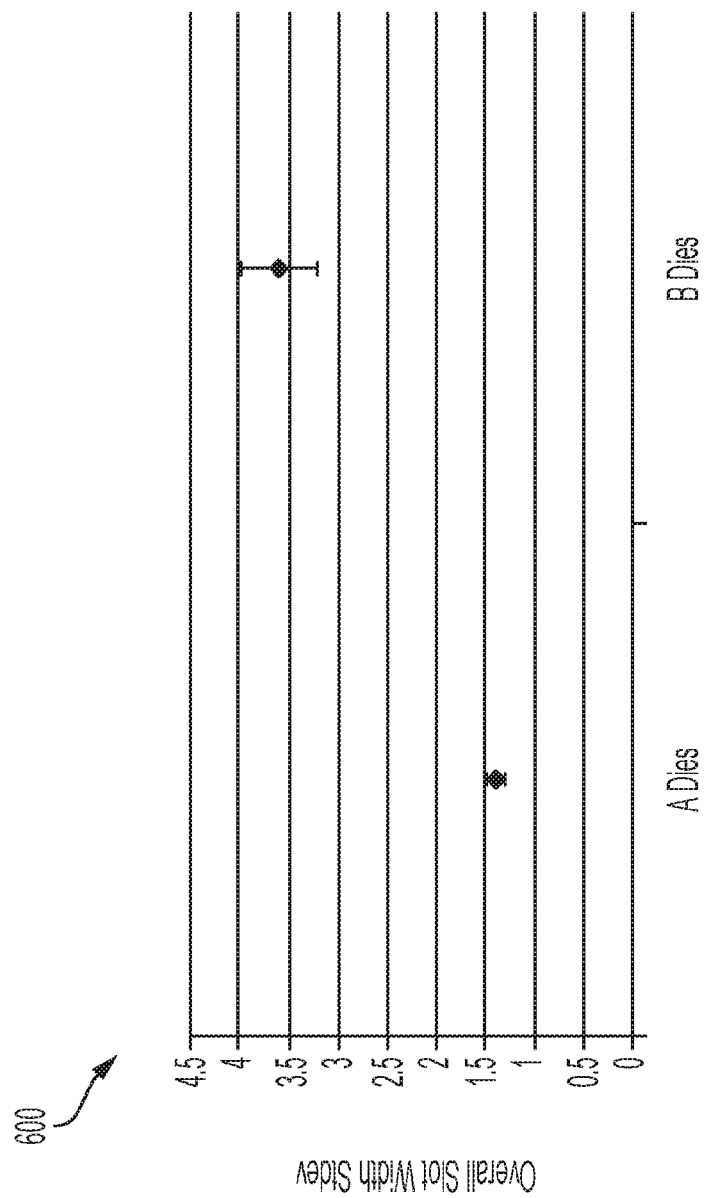
FIG. 5 is a graph the standard deviation of overall slot width variance for honeycomb extrusion dies coated with inorganic particles via a deposition process according to some embodiments and via a conventional high temperature deposition process.

By developing the coating process such that one or more types of inorganic particles can be deposited at or below the austenite transformation temperature of a metallic material of an extrusion die, the slot width variation in the extrusion die can be significantly decreased. FIG. 5 shows a graph 600 of overall slot width standard deviation for extrusion dies coated using the low temperature deposition process shown in Table 1 (labeled "A Dies") and dies coated using the conventional deposition process shown in Table 1 (labeled "B Dies"). Overall slot width standard deviation is a measurement of the variation in the width distance of the slots between adjacent pins in an extrusion die (e.g., slots 108 and pins 106 of extrusion die 100). Smaller variations will in some embodiments produce extruded honeycomb products with more consistent wall thicknesses, which is particularly desirable in high precision or dimensionally sensitive applications. In some embodiments, the variation is zero or a close to zero as feasible.

The results reported in graph 600 are based on measuring the overall slot width variation of eight dies (four A Dies and four B Dies) that were subjected to the same number of coating cycles. By using the low temperature deposition processes, the overall slot width standard deviation can be reduced by over 50%. Graph 600 shows about a 57% reduction, from a deviation of about 3.5 to a deviation of about 1.5. As shown in the bar graph 700 of FIG. 6, this results in about a 65% decrease in the within slot width variance for an extrusion die. Bar graph 700 shows the average within slot width variance for the tested A Dies and B Dies.

With respect to a honeycomb extrusion die, in which the accuracy of the extruded part is dependent on the width of slots in the die that define walls of the extruded honeycomb, a reduction in overall slot width variation may be particularly beneficial to extend the useful lifetime of an extrusion die (i.e., the period of time during which the die consistently produces components of a target quality and/or dimensional accuracy). As shown in graph 800 of FIG. 7, the slot width variance within an extrusion die increases significantly with subsequent high temperature coating cycles. In some cases, as shown in graph 800, this increase in slot width variance can be linear with each coating cycle. In some embodiments, due to the low temperature deposition processes of the present application, the slope of this linear trend is decreased, thereby extending the lifetime of an extrusion die, even though subjected to numerous abrasion-resistant coating and re-coating processes during its lifetime.

Figure 6:
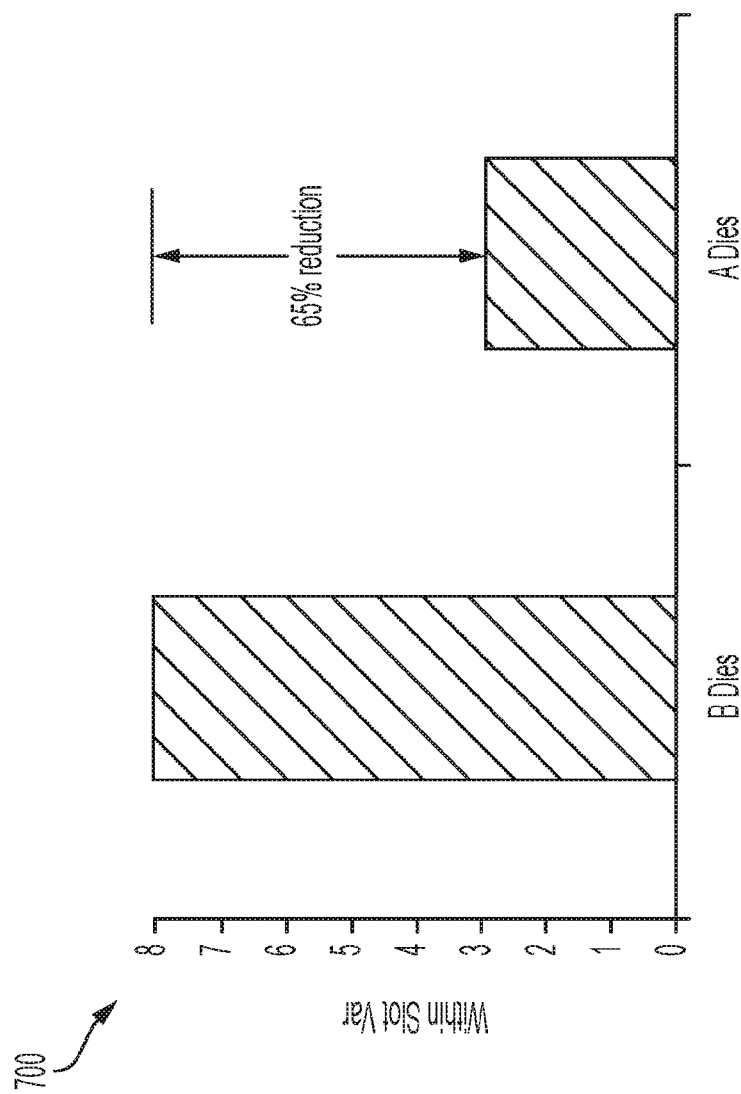
FIG. 6 is a bar graph illustrating the slot width variation within honeycomb extrusion dies coated with inorganic particles via a conventional high temperature deposition process and via a low temperature deposition process according to some embodiments.
Figure 7:
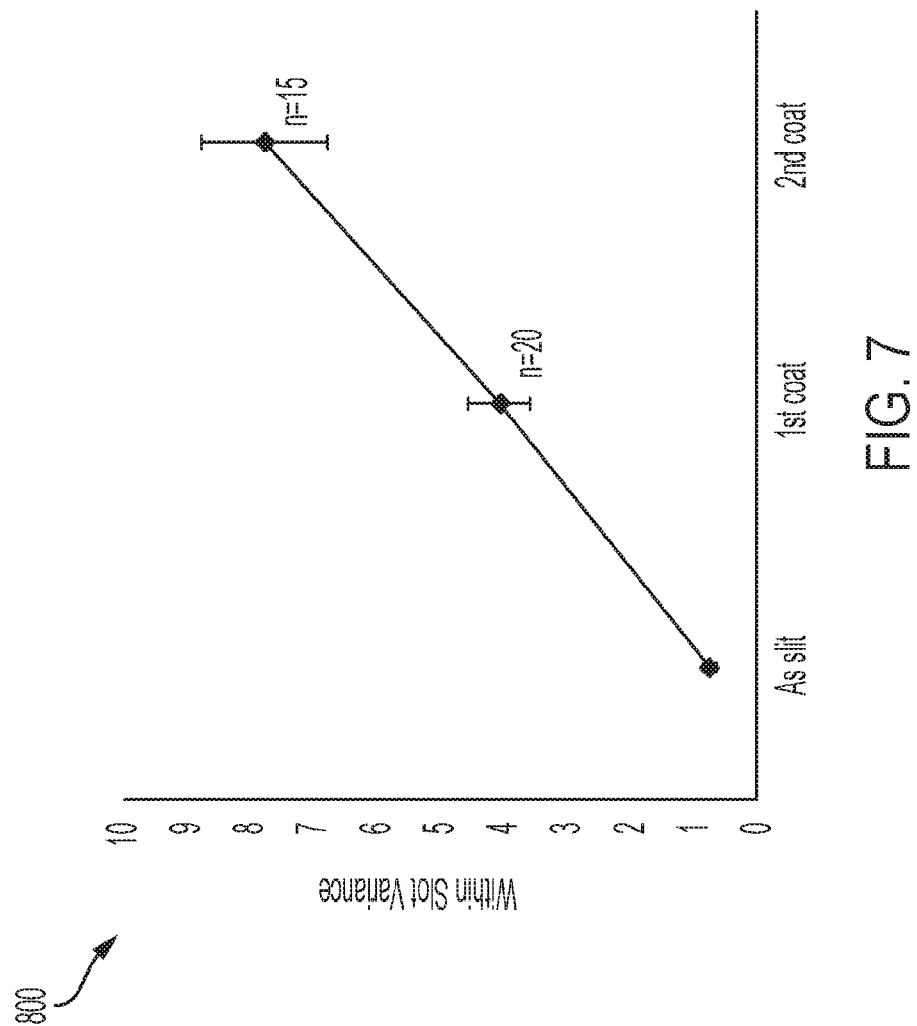
FIG. 7 is a graph of slot width variance within a honeycomb extrusion die as a function of the number of high temperature coating processes used to deposit inorganic particles on the honeycomb extrusion die.

While the test results shown in FIGS. 5-7 are the results of tests based on a low temperature deposition process shown in Table 1, similar results can be achieved using additional or alternative methods according to the present application. Any of the methods discussed herein for reducing, or eliminating, austenite transformation and/or controlling the delta CTE during a deposition process will reduce the slot width variation within an extrusion die in a similar fashion.

Figure 8:
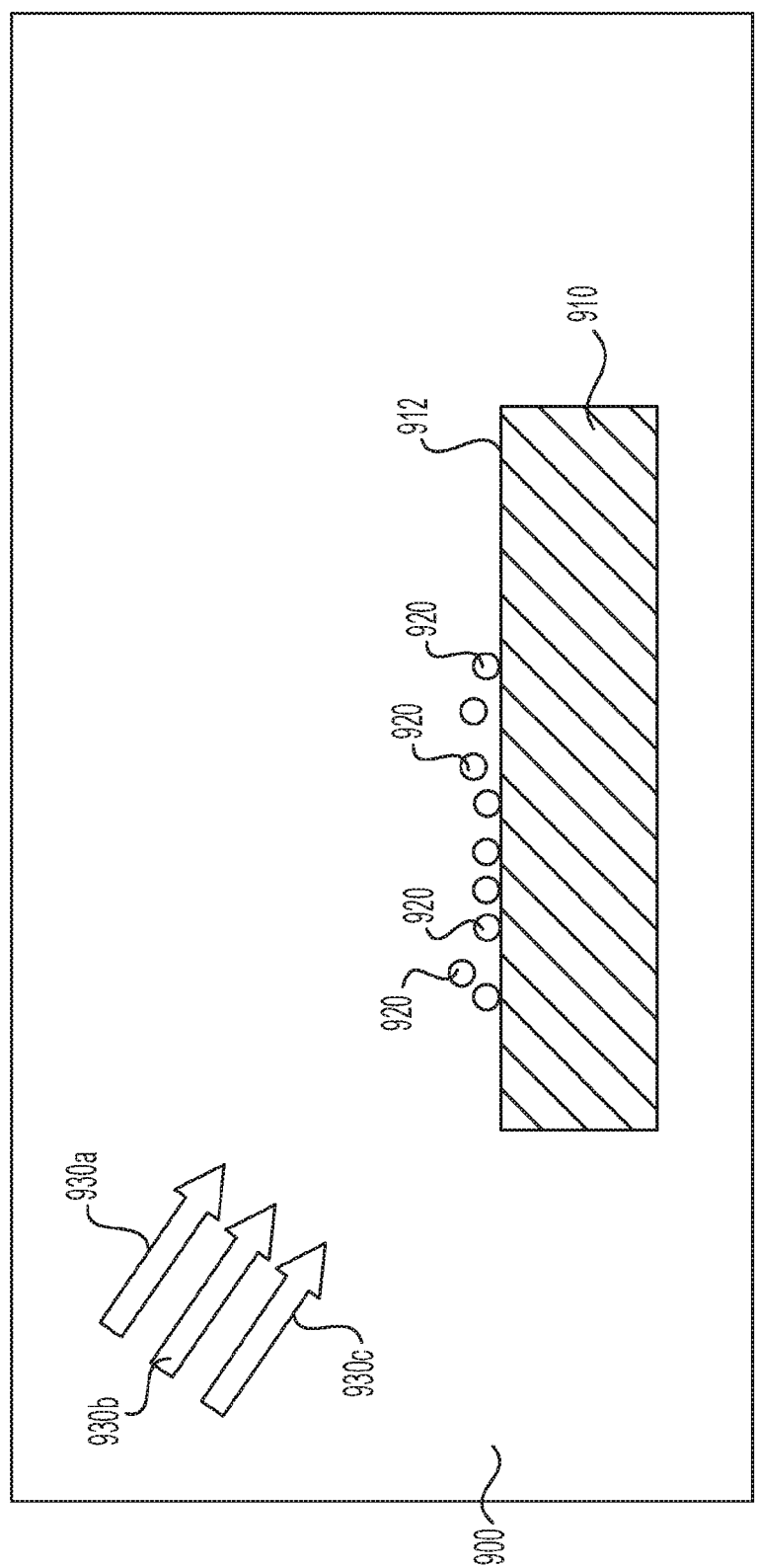
FIG. 8 illustrates a deposition process according to some embodiments.

FIG. 8 illustrates a deposition process for depositing inorganic particles 920 on a surface 912 of a metal substrate 910 within a deposition chamber 900. The process illustrated in FIG. 8 may be a vapor deposition process, such as a chemical vapor deposition (CVD) process. One or more gases 930 (e.g., gas 930a, gas 930b, and gas 930c) are introduced into chamber 900 to form inorganic particles within chamber 900, which deposit onto surface 912. One or more gases 930 may be source gases for one or more elements of an inorganic particle. One or more gases 930 may be carrier gases. Any suitable type of source gas or carrier gas, including those discussed herein, may be introduced into chamber at appropriate flow rates to form and deposit inorganic particles 920 onto surface 912 of substrate 910.

In some embodiments, metal substrate 910 may be an extruder component. In some embodiments the extruder component may include an extrusion die (e.g., extrusion die 100) or a component of an extrusion die (e.g., die body 102). In some embodiments, substrate 910 may include extrusion die 100, or portion of extrusion die 100, having a plurality of pins 106 and the exterior surface of one or more of the plurality of pins 106 defines the surface 912 of metal substrate 910 onto which inorganic particles are deposited during a deposition process.

Inorganic particles 920 may be any type of inorganic particle discussed herein. The deposition process illustrated in FIG. 8 may be used to deposit any number of inorganic particle layers or abrasion-resistant coating layers discussed herein. And the deposition process illustrated in FIG. 8 may be used to deposit inorganic particles according to any deposition process discussed herein. For example, the deposition process illustrated in FIG. 8 may be used to deposit TiCN and/or boron-doped TiCN particles according to the low temperature deposition process of Table 1.

In some embodiments, prior to deposition of TiCN and/or boron-doped TiCN particles 920, a layer of TiN particles 920 may be deposited on surface 912 of metal substrate 910 at a temperature above the austenite transformation temperature of the metallic material of metal substrate 910. TiN adheres well to metal surface 912 and serves to adhere B—TiCN particles and/or TiCN particles to surface 912.

TiN particle deposition may be performed at a temperature in the range of 820 degrees C. to 860 degrees C., including subranges. For example, TiN particle deposition may be performed at 820 degrees C., 830 degrees C., 840 degrees C., 850 degrees C., or 860 degrees C., or within any range having any two of these values as endpoints. In some embodiments, TIN deposition may be performed for 1 hour to 6 hours, including subranges. For example, TiN deposition may be performed for 1 hour, 2 hours, 3 hours, 4 hours, 5 hours, or 6 hours, or within any range having any two of these values as endpoints. In some embodiments, TIN particle deposition may form a layer of TIN on surface 912 having a thickness in the range of 1 micron to 5 microns, including subranges. For example, TiN particle deposition may form a layer of TiN on surface 912 having a thickness of 1 micron, 2 microns, 3 microns, 4 microns, or 5 microns, or within any range having any two of these values as endpoints.

In some embodiments, after deposition of the TiN particles 920, the layer of TiN particles 920 and metal substrate 910 may be cooled to a temperature below the martensite transformation temperature of the metallic material of substrate 910 such that any austenite formed in the metallic material during deposition of TiN is transformed to martensite. In some embodiments, the layer of TiN particles 920 and metal substrate 910 may be cooled to a temperature in the range of 100 degrees C. to 400 degrees C., including subranges. For example, the layer of TiN particles 920 and metal substrate 910 may be cooled to 100 degrees C., 150 degrees C., 200 degrees C., 250 degrees C., 300 degrees C., 350 degrees C., or 400 degrees C., or within any range having any two of these values as endpoints. The layer of TiN particles 920 and metal substrate 910 may be held at this reduced temperature, or within any of these reduced temperature ranges, for a sufficient amount of time to allow any austenite to transform to martensite.

In some embodiments, prior to depositing TiN particles 920, surface 912 may be prepared at elevated temperature to clean surface 912. In some embodiments, the surface preparation may include removing organic particles from surface 912 by reacting the organic particles with hydrochloric acid (HCl) formed by flowing titanium tetrachloride (TiCl$_4$) gas and hydrogen (H$_2$) gas over surface 912. In some embodiments, the surface preparation may be performed at a temperature in the range of 820 degrees C. to 860 degrees C., including subranges. For example, surface preparation may be performed at 820 degrees C., 830 degrees C., 840 degrees C., 850 degrees C., or 860 degrees C., or within any range having any two of these values as endpoints. In some embodiments, surface preparation may be performed for 5 minutes to 30 minutes, including subranges. For example, surface preparation may be performed for 5 minutes, 10 minutes, 15 minutes, 20 minutes, 25 minutes, or 30 minutes, or within any range having any two of these values as endpoints.

While the surface preparation and TiN deposition processes may be performed at a temperature above the austenite transformation temperature of substrate 910, performing these high temperature steps on surface 912 prior to deposition of additional coating layers (e.g., B—TiCN and/or TiCN) limits the amount of austenite transformation on surface 912 and/or within substrate 910. In some embodiments, some degree of austenite transformation is permitted while maintaining acceptable results, e.g., as limited amounts of austenite transformation in these steps is not likely to result in significant slot width variation. Further, in some embodiments, cooling substrate 910 below the martensitic transformation temperature after TiN deposition and/or surface preparation can transform austenite formed during either of these steps back to martensite. This decreases the CTE of substrate 910 for deposition of additional inorganic particles, such as boron-doped TiCN particles and/or TiCN particles.

As shown in Table 1, deposition of B—TiCN particles 920 according to embodiments of the present application may be performed at a maximum deposition temperature of 770 degrees C. This is below the austenite transformation temperature of some steels, for example a conventional 422 martensitic stainless steel. In some embodiments, deposition of B—TiCN particles 920 may be performed at a maximum deposition temperature in the range of 600 degrees C. to 860 degrees C., including subranges. For example, deposition of B—TiCN particles 920 may be performed at a maximum deposition temperature of 600 degrees C., 620 degrees C., 640 degrees C., 660 degrees C., 680 degrees C., 700 degrees C., 720 degrees C., 740 degrees C., 760 degrees C., 800 degrees C., 820 degrees C., 840 degrees C., or 860 degrees C., or within any range having any two of these values as endpoints.

In some embodiments, deposition of B—TiCN particles at a maximum deposition temperature may be performed for 10 hours to 20 hours, including subranges. For example, B—TiCN deposition may be performed for 10 hours, 11 hours, 12 hours, 13 hours, 14 hours, 15 hours, 16 hours, 17 hours, 18 hours, 19 hours, or 20 hours, or within any range having any two of these values as endpoints. Multiple layers of B—TiCN particles may be deposited by multiple deposition processes, with each deposition process performed for the same or a different length of time. For example, the low temperature deposition process of Table 1 includes three depositions of B—TiCN at 770 degrees C. for 17 hours each (51 hours total). Multiple layers of B—TiCN particles may be layered with TiCN particles as discussed herein.

TiCN particles may be deposited at any of the maximum deposition temperatures, temperature ranges, times, and time ranges as discussed herein for B—TiCN. Other inorganic particles that may be deposited at these maximum deposition temperatures, temperature ranges, times, and time ranges include, but are not limited to, boron (B) particles, aluminum titanium nitride (Al—Ti—N) particles, titanium aluminum nitride (Ti—Al—N) particles, and chromium nitride (CrN) particles. In some embodiments, a combination of any of the inorganic particles discussed herein may be deposited onto surface 912 of substrate 910. Deposition of any of the inorganic particles discussed herein may form one or more layers of inorganic material onto surface 912 of substrate 910. The inorganic particles deposited according to embodiments discussed herein may form an abrasion-resistant coating (e.g., coating 1020) on surface 912 of substrate 910.

All or a portion of metal substrate 910 may be formed of a metallic material having an austenite transformation temperature. In some embodiments, at least surface 912 of substrate 910 may be formed of a metallic material having an austenite transformation temperature.

The composition of a metallic material forming metal substrate 910 will determine whether or not a maximum deposition temperature is at or below the material's austenite transformation temperature. For example, since TiN may be deposited at 820 degrees C. or more, only in cases where the austenite transformation temperature of the metallic material is higher than 820 degrees C. will TiN particles be deposited at a temperature lower than the austenite transformation temperature of the metallic material.

In some embodiments, a metallic material of metal substrate 910 may be a steel. In some embodiments, a metallic material of metal substrate 910 may be a martensitic steel. In some embodiments, a metallic material of metal substrate 910 may be a martensitic stainless steel. In some embodiments, a metallic material of metal substrate 910 may be a precipitation hardening martensitic steel. In some embodiments, a metallic material of metal substrate 910 may not be a precipitation hardening martensitic stainless steel. In some embodiments, a metallic material of metal substrate 910 may be a conventional steel material. In some embodiments, metal substrate 910 may include an alloyed metallic material with an increased Ac1 temperature as discussed herein.

In some embodiments, the low temperature deposition processes according to embodiments discussed herein may be used to deposit inorganic particles onto a previously deposited abrasion-resistant coating on a surface of a substrate (e.g., surface 912). In such embodiments, inorganic particles may be deposited onto the prior-deposited abrasion-resistant coating at a temperature at or below the austenite transformation temperature of a metallic material of the substrate.

In some embodiments, prior to depositing inorganic particles onto a previously deposited abrasion-resistant coating, an exterior surface of the previously deposited abrasion-resistant coating may be prepared prior to deposition of the inorganic particles. In such embodiments, the surface preparation may include removing oxides from the exterior surface by flowing boron trichloride ($BCl_3$) over the exterior surface. In some embodiments, the surface preparation may include removing organic particles from the exterior surface by reacting the organic particles with hydrochloric acid (HCl) formed by flowing titanium tetrachloride ($TiCl_4$) gas and hydrogen ($H_2$) gas over the exterior surface. In some embodiments, the surface preparation may include removing organic particles from the exterior surface by flowing boron trichloride ($BCl_3$) and by reacting the organic particles with hydrochloric acid (HCl) formed by flowing titanium tetrachloride ($TiCl_4$) gas and hydrogen ($H_2$) gas over the exterior surface. Surface preparation of the exterior surface may help newly deposited inorganic particles adhere to the exterior surface without the need to deposit a TiN layer for adherence.

While some embodiments discussed herein refer specifically to a chemical vapor deposition process for depositing inorganic particles, any suitable vapor deposition process may be used to deposit inorganic particles at or below the austenite transformation temperature of a substrate. For example, a physical vapor deposition (PVD) process may be used to deposit inorganic particles onto a substrate.

In some embodiments, the delta CTE between a wear resistant coating and a metallic material of a substrate may be controlled by developing the coating to have an apparent CTE at a target value (or range). In such embodiments, developing the coating with a targeted value for the apparent CTE of the coating may result in a delta CTE that is less than or equal to $10 \times 10^{-6}$/degrees C. The apparent CTE of a coating may be tailored by depositing a multi-layer coating having layers composed of inorganic particles with different CTE values to control the apparent (cumulative) CTE of the coating as a whole.

This delta CTE control approach utilizes the rule of mixtures to develop a layered coating structure and composition that creates a desired apparent CTE for the coating. This approach can also optimize the surface finish characteristics of a coating by utilizing B—TiCN particles, but minimizing the influence of a B—TiCN layer's CTE on the apparent CTE of a coating.

B—TiCN particles are capable of forming a coating layer having a surface roughness of less than 0.1 microns. Accordingly, it may be desirable to include one or more B—TiCN coating layers to provide a smooth abrasion-resistant coating. And in particular, it may be beneficial to deposit a B—TiCN coating layer as the exterior most coating layer to provide a smooth abrasion-resistant coating.

However, as shown in Table 2 below, B—TiCN has a relatively low CTE compared to several other abrasion-resistant coating materials. Since B—TiCN has a lower CTE than other coating materials, it will have the highest delta CTE with a metallic material discussed herein. By using the rule of mixtures as discussed herein, a coating layer that meets both CTE and surface finish requirements can be designed.

TABLE 2

CTE for several abrasion-resistant coating materials

| Coating Type | CTE × 10 × $10^{-6}$/ deg C. | Surface Roughness ($R_a$) microns | Morphology |
| --- | --- | --- | --- |
| TiCN | 8.5 | 0.4 | Columnar Crystals |
| B—TiCN | 5 | 0.05 | Rounded |
| TiN | 9.5 | 0.25 | Crystalline |
| AlTiN | 6.5 | 0.4 | Crystalline |

Figure 9:
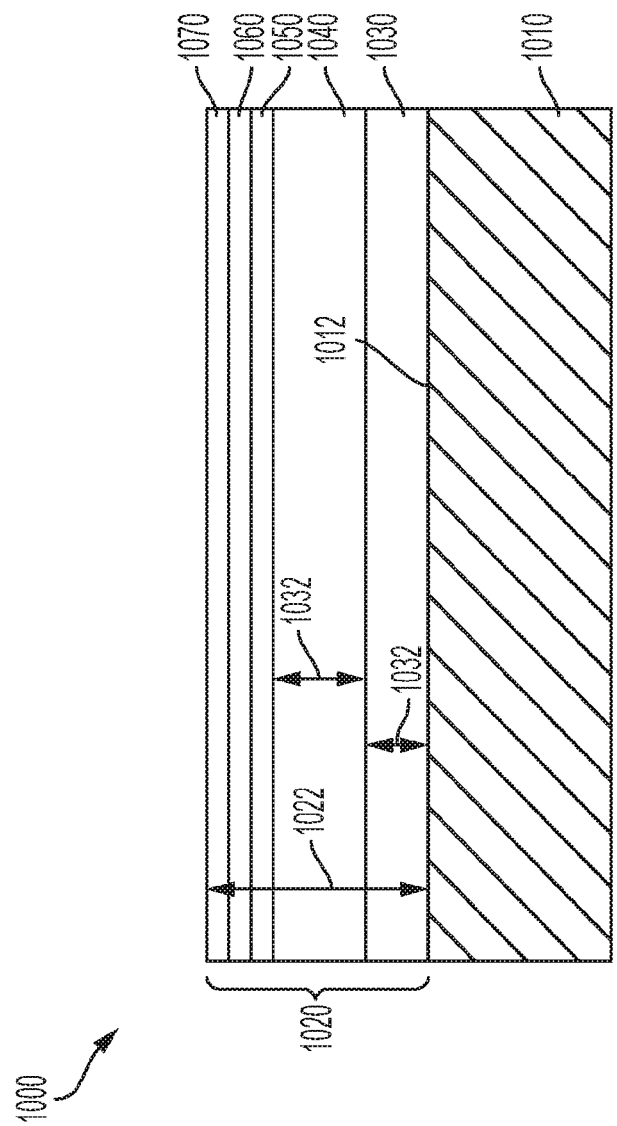
FIG. 9 illustrates a coated article according to some embodiments.

FIG. 9 illustrates a coated article 1000 according to some embodiments. Coated article 1000 includes a substrate 1010 and an abrasion-resistant coating 1020 disposed on a surface 1012 of substrate. Substrate 1010 may be the same as or similar to substrate 910. Abrasion-resistant coating 1020 is formed by depositing inorganic particles onto surface 1012 of substrate 1010.

Abrasion-resistant coating 1020 may include one or more coating layers formed by depositing inorganic particles, such as a first coating layer 1030, a second coating layer 1040, a third coating layer 1050, a fourth coating layer 1060, and a fifth coating layer 1070. While coated article 1000 is illustrated as having five coating layers, abrasion-resistant coating 1020 may include any number of coating layers. For example, abrasion-resistant coating 1020 may include 1, 2, 3, 4, 5, 6, 7, 8, 9, 10, or more coating layers. In embodiments including two or more coating layers, abrasion-resistant coating 1020 may be called a multi-layer abrasion-resistant coating.

Each coating layer of coating 1020 may be formed of vapor deposited inorganic particles. In some embodiments, one or more coating layers may be composed of different types of inorganic particles. In some embodiments, one or more coating layers may be composed of the same type of inorganic particles. In some embodiments, one or more coating layers may be deposited using conventional deposition processes. In some embodiments, one or more coating layers may be deposited using low temperature deposition processes according to embodiments discussed herein.

In some embodiments, first coating layer 1030 of inorganic particles may be deposited on surface 1012 of substrate 1010 in a first deposition process and one or more additional coating layers (e.g., layers 1040, 1050, 1060, and/or 1070) may be deposited in additional deposition processes. For example, second coating layer 1040 may be deposited in a second deposition process that deposits additional inorganic particles onto the inorganic particles deposited in the first deposition process (i.e., onto coating layer 1030). Additional coating layers may be deposited at or below the austenite temperature (e.g., a temperature that does not exceed the austenite transformation temperature) of a metallic material of the substrate 1010.

Abrasion-resistant coating 1020 may have a total thickness 1022 in the range of 1 micron to 100 microns, including subranges. For example, thickness 1022 may be 1 micron, 2 microns, 5 microns, 10 microns, 15 microns, 20 microns, 25 microns, 30 microns, 35 microns, 40 microns, 45 microns, 50 microns, 55 microns, 60 microns, 65 microns, 70 microns, 75 microns, 80 microns, 85 microns, 90 microns, 95 microns, or 100 microns, or within a range having any two of these values as endpoints. In some embodiments, thickness 1022 may be in the range of 2 microns to 65 microns.

Individual coating layers of a multi-layer coating (e.g., layers 1030, 1040, 1050, 1060, and/or 1070) have a thickness 1032 that is a fraction of total thickness 1022. In some embodiments, thickness 1032 of one or more individual coating layers may be the same. In some embodiments, thickness 1032 of one or more individual coating layers may be different. The thickness 1032 of individual coating layers may be tailored to provide a desired apparent CTE for abrasion-resistant coating 1020. Thickness 1032 of individual layers may be in the range of 0.5 microns to 100 microns, including subranges. For example, thickness 1032 of individual layers may be 0.5 microns, 1 micron, 2 microns, 5 microns, 10 microns, 15 microns, 20 microns, 25 microns, 30 microns, 35 microns, 40 microns, 45 microns, 50 microns, 55 microns, 60 microns, 65 microns, 70 microns, 75 microns, 80 microns, 85 microns, 90 microns, 95 microns, 99 microns, or 100 microns, or within a range having any two of these values as endpoints.

In some embodiments individual thickness between particles deposited in successive deposition steps will not be separately discernable. For example, multiple particle deposition passes (e.g., first particles deposited in a first pass and second particles deposited in a second, subsequent pass) and/or multiple different materials (e.g., both B—TiCN and TiCN) may be combined or interspersed in or as a single layer having a single thickness.

Coating layers (e.g., layers 1030, 1040, 1050, 1060, and/or 1070) of abrasion-resistant coating 1020 may be formed of any inorganic particle discussed herein. In some embodiments, one or more coating layers of abrasion-resistant coating 1020 may include boron-doped titanium carbonitride particles forming a boron-doped titanium carbonitride layer. In some embodiments, one or more coating layers of abrasion-resistant coating 1020 may include titanium carbonitride particles forming a titanium carbonitride layer. In some embodiments, one or more coating layers of abrasion-resistant coating 1020 may include titanium nitride particles forming a titanium nitride layer. In some embodiments, first coating layer 1030 may be a TiN particle layer to aid in adhering additional layers to surface 1012.

In some embodiments, abrasion-resistant coating 1020 may be a multi-layer coating including a boron-doped titanium carbonitride layer and a titanium carbonitride layer. In some embodiments, abrasion-resistant coating 1020 may be a multi-layer coating including a plurality of boron-doped titanium carbonitride layers and a plurality of titanium carbonitride layers. In some embodiments, abrasion-resistant coating 1020 may be a multi-layer coating including a boron-doped titanium carbonitride layer, a titanium carbonitride layer, and a titanium nitride layer. In some embodiments, abrasion-resistant coating 1020 may be a multi-layer coating including a plurality of boron-doped titanium carbonitride layers, a plurality of titanium carbonitride layers, and a plurality of titanium nitride layers.

In some embodiments, an outermost layer of abrasion-resistant coating 1020 (e.g., fifth coating layer 1070 shown in FIG. 9) may be a boron-doped titanium carbonitride layer formed of boron-doped titanium carbonitride particles. Forming an outermost layer of abrasion-resistant coating 1020 using boron-doped titanium carbonitride particles may provide an abrasion-resistant coating 1020 with a desirable top surface roughness, for example a top surface roughness (Ra) in the range of 0.1 micron to 0.025 microns. As shown in Table 2, other types of inorganic particles create a layer with a higher surface roughness (Ra).

In some embodiments, an outermost layer of boron-doped TiCN may have a thickness of at least 5 microns. It has been found in some embodiments that an outermost layer of boron-doped TiCN having a thickness of at least 5 microns is enough to keep the surface roughness of a multi-layer coating at an acceptable level, e.g., particularly for low extrusion pressures. In practice, the acceptable surface finish is dependent on extrusion batch compositions and the target outcome parameters, but for batches with higher wall drags in particular, a surface roughness (Ra) between 0.05 microns and 0.2 microns has been found to yield acceptable results.

The apparent CTE of a multi-layer abrasion-resistant coating (e.g., abrasion-resistant coating 1020) can be controlled by tailoring the number, thickness, and inorganic material of individual coating layers of the multi-layer coating. For purposes of the present application, the apparent CTE (A) of a multi-layer coating is calculated using the following equation:

$$A = (f_1)(CTE_1) + (f_2)(CTE_2) + (f_3)(CTE_3) \ldots + (f_n)(CTE_n)$$ (Equation 1)

where: f=the fractional thickness of a layer and CTE=the coefficient of thermal expansion of a layer. Fractional thickness is calculated by dividing the thickness of a layer (Tl) by the total thickness of a multi-layer coating (Tt).

So, the fractional coefficient of thermal expansion for each layer is calculated with the following equation:

$$fCTE = (Tl/Tt) * CTEl$$ (Equation 2)

where: fCTE=the fractional coefficient of thermal expansion for a respective layer, Tl=the thickness of a respective layer, Tt=the total thickness of the multi-layer coating, and CTEl=the coefficient of thermal expansion for a respective layer.

As an example, a multilayer coating having a 2 micron thick TiN coating, a 36.6 micron thick TiCN coating, and a 6.4 micron thick B—TiCN coating has an apparent CTE of $8 \times 10^{-6}$/degrees C. In this example, even with a steel that has transformed to austenite and its corresponding CTE increase to $18 \times 10^{-6}$/degrees C., the delta CTE between the steel and this multi-layer coating is equal to $10 \times 10^{-6}$/degrees C.

In some embodiments, the apparent CTE of a multilayer coating may be in the range of $8 \times 10^{-6}$/degrees C. to $9 \times 10^{-6}$/degrees C., including subranges. For example, the apparent CTE for a multilayer coating may be 8×10/degrees C., 8.1×10/degrees C., $8.2 \times 10^{-6}$/degrees C., $8.3 \times 10^{-6}$/degrees C., $8.4 \times 10^{-6}$/degrees C., $8.5 \times 10^{-6}$/degrees C., $8.6 \times 10^{-6}$/degrees C., $8.7 \times 10^{-6}$/degrees C., $8.8 \times 10^{-6}$/degrees C., $8.9 \times 10^{-6}$/degrees C., or $9 \times 10^{-6}$/degrees C., or within any range having any two of these values as endpoints.

As shown in Table 2, the CTE of boron-doped TiCN by itself is $5 \times 10^{-6}$/degrees C. So, if a steel transforms to austenite and its CTE increases to $18 \times 10^{-6}$/degrees C., this would create a delta CTE of $13 \times 10^{-6}$/degrees C. with a boron-doped TiCN layer. As discussed above, this can cause dimensional changes in a steel tool, e.g., permanent deformation of pins in an extrusion die. By controlling the CTE of a multilayer coating as discussed herein, boron-doped TiCN can be used in a multi-layer coating (and in particular as the outermost layer of a multilayer coating) to control the surface roughness of the coating. Smoother coating surfaces may be advantageously utilized in some embodiments to reduce the extrusion pressure needed to extrude an extrusion batch composition and/or to increase throughputs.

Various coated metal substrates may be made by the low temperature deposition processes and apparent CTE control methods discussed herein. Exemplary coated substrates include, but are not limited to, coated extrusion dies, coated honeycomb extrusion dies, and coating cutting tools, such as grinding tools, blades, or drill bits.

In some embodiments, the coated metal substrate may include a steel body (e.g., die body 102) and a multi-layer abrasion-resistant coating (e.g., coating 1020) having a plurality of titanium carbonitride layers and a plurality of boron-doped titanium carbonitride layers deposited onto a surface (e.g., an exterior surface of one or more pins 106) of the steel body. The surface of the steel body may include a steel with a coefficient of thermal expansion of X/degrees C. measured at a temperature of T degrees C. and the multi-layer abrasion-resistant coating may include an apparent coefficient of thermal expansion of Y/degrees C. measured at the temperature T, where the difference between X and Y is $10 \times 10^{-6}$/degrees C. or less. In such embodiments, the coefficients of thermal expansion for the steel and the multi-layer abrasion-resistant coating may be measured by heating the steel and the multi-layer abrasion-resistant coating to a temperature at or above the austenite transformation temperature of the steel and cooling the steel and the multi-layer abrasion-resistant coating to the temperature T, where T is equal to one degree C. greater than the temperature at which the steel transforms to martensite (Ms) during the cooling. Measuring the delta CTE at a temperature equal to one degree C. greater than the temperature at which the steel transforms to martensite, after transforming the steel to austenite, captures the highest delta CTE between a steel that transformed to austenite and a multi-layer abrasion-resistant coating according to embodiments discussed herein.

In some embodiments, a deposition method for making a coated metal substrate may include depositing a multi-layer abrasion-resistant coating having a plurality of titanium carbonitride layers and a plurality of boron-doped titanium carbonitride layers on a surface of a steel substrate in a plurality of deposition processes that each deposit a layer of the multi-layer abrasion-resistant coating at a deposition temperature that is above the austenite transformation temperature of a steel material of the metal substrate. In such embodiments, the apparent CTE of the multi-layer abrasion-resistant coating may be tailored such that, when the delta CTE is measured at a temperature equal to one degree C. greater than the temperature at which the steel material transforms to martensite during cooling, the delta CTE is $10 \times 10^{-6}$/degrees C. or less.

Alloying to Control Austenite Transformation Temperature

In some embodiments, the alloy composition of a steel is developed with an increased austenite transformation (Ac1) temperature, relative to conventional steels having similar mechanical properties. For example, the alloy composition for a conventional steel having an Ac1 temperature of about 805 degrees C. (e.g., a 422 stainless steel) may be set to produce a modified steel having an Ac1 temperature of more than 805 degrees C. (e.g., 850 degrees C.). A corresponding reduction in austenite transformation can be realized due to influences that the disclosed compositions have on the Ac1 temperature of the steel. As another example, steel alloys disclosed herein can be developed in comparison to a base composition such as that of a conventional 17-4 precipitation hardened steel.

By modifying the Ac1 temperature of a conventional steel, the delta CTE during inorganic particle deposition can be minimized by avoiding substantial amounts, or any, austenite formation in the steel. As discussed herein, by minimizing the delta CTE, extrusion die pin deformation, and thus slot width variability, can be minimized. This leads to improved consistency in extruded products, for example more consistent wall thicknesses for extruded honeycomb products.

As used herein, the term "conventional steel" means a steel having an alloy defined and designated by an industry-recognized standards organization, such as the American Society for Testing and Materials (ASTM), the American Iron and Steel Institute (AISI), and the Society of Automotive Engineers (SAE). In some embodiments, the conventional steel may be a stainless steel. In some embodiments the conventional steel may be a martensitic steel. In some embodiments, the conventional steel may be a martensitic stainless steel. In some embodiments, the conventional steel may be a precipitation hardening steel. In some embodiments, the conventional steel may be a magnetic steel. As used herein, a "magnetic" steel is a steel that will magnetically hold a magnet when a surface of a component made of the magnetic steel and a magnet disposed on that surface are positioned perpendicular to the ground. Exemplary conventional steels include, but are not limited to, 422 stainless steels, 450 stainless steels, and type 630 or 17-4 PH (precipitation hardening) stainless steels.

Developing an alloy composition of a steel according to embodiments discussed herein includes selecting the weight percentages of the alloy elements present in the amounts and ranges disclosed herein. Alloy compositions developed according to embodiments discussed herein may have mechanical properties substantially comparable or equivalent to those of conventional steels, such hardness, hardening properties, magnetism, or yield strength.

By increasing a steel's austenite transformation temperature, inorganic particle deposition (and other manufacturing operations) can take place at temperatures above an austenite transformation temperature of a conventional steel, while maintaining a stable and essentially constant CTE. For extrusion dies in particular, this reduces the delta CTE between an abrasion-resistant coating (e.g., coating 1020) and a steel. This allows a significant range of abrasion-resistant coatings to be applied without significant deformation an extrusion die's pins. Some examples of these coatings used for extrusion dies include, but are not limited to, TiCN, boron doped TiCN, Al—Ti—N(aluminum titanium nitride), Ti—Al—N(titanium aluminum nitride), CrN, and TiN.

Table 3 below shows an example of an alloy composition of a conventional 422 stainless steel in comparison to one alloy developed according to the disclosure herein. As shown in Table 3, the weight percent (wt %) of particular alloy elements may be more or less than those in a conventional 422 stainless steel composition, which results in an Ac1 temperature above 850 degrees C. in comparison to 805 degrees C. for 422 stainless steel.

TABLE 3

Comparison of conventional and modified 422 stainless steel (alloy elements in wt %)

| | C | Si | Mn | Cu | Ni | Cr | Mo | V | W | Co | Ac1 (° C.) |
|---|---|---|---|---|---|---|---|---|---|---|---|
| Conventional | 0.225 | 0.4 | 0.7 | 0.25 | 0.85 | 12 | 1.075 | 0.25 | 1.075 | 0.05 | 805 |
| Modified | 0.2 | 1 | 0.01 | 0 | 0.5 | 13.5 | 1.25 | 0.5 | 1.25 | 0 | >850 |

In some embodiments, the Ac1 temperature of a developed stainless steel alloy as disclosed herein may be increased at least 10 degrees C. and up to 200 degrees C., including subranges, with respect to conventional steels having similar mechanical properties. For example, the Ac1 temperature can be increased by 10 degrees C., 20 degrees C., 30 degrees C., 40 degrees C., 50 degrees C., 60 degrees C., 70 degrees C., 80 degrees C., 90 degrees C., 100 degrees C., 110 degrees C., 120 degrees C., 130 degrees C., 140 degrees C., 150 degrees C., 160 degrees C., 170 degrees C., 180 degrees C., 190 degrees C. or 200 degrees C., or within any range having any two of these values as endpoints.

In some embodiments, a steel according to embodiments discussed herein may have an Ac1 temperature of 850 degrees C. or more. In some embodiments, a steel according to embodiments discussed herein may have an Ac1 temperature of 850 degrees C. to 1000 degrees C., including subranges. For example, a steel may have an Ac1 temperature of 850 degrees C., 860 degrees C., 870 degrees C., 880 degrees C., 890 degrees C., 900 degrees C., 910 degrees C., 920 degrees C., 930 degrees C., 940 degrees C., 950 degrees C., 960 degrees C., 970 degrees C., 980 degrees C., 990 degrees C., or 1000 degrees C., or within any range having any two of these values as endpoints.

Figure 10:
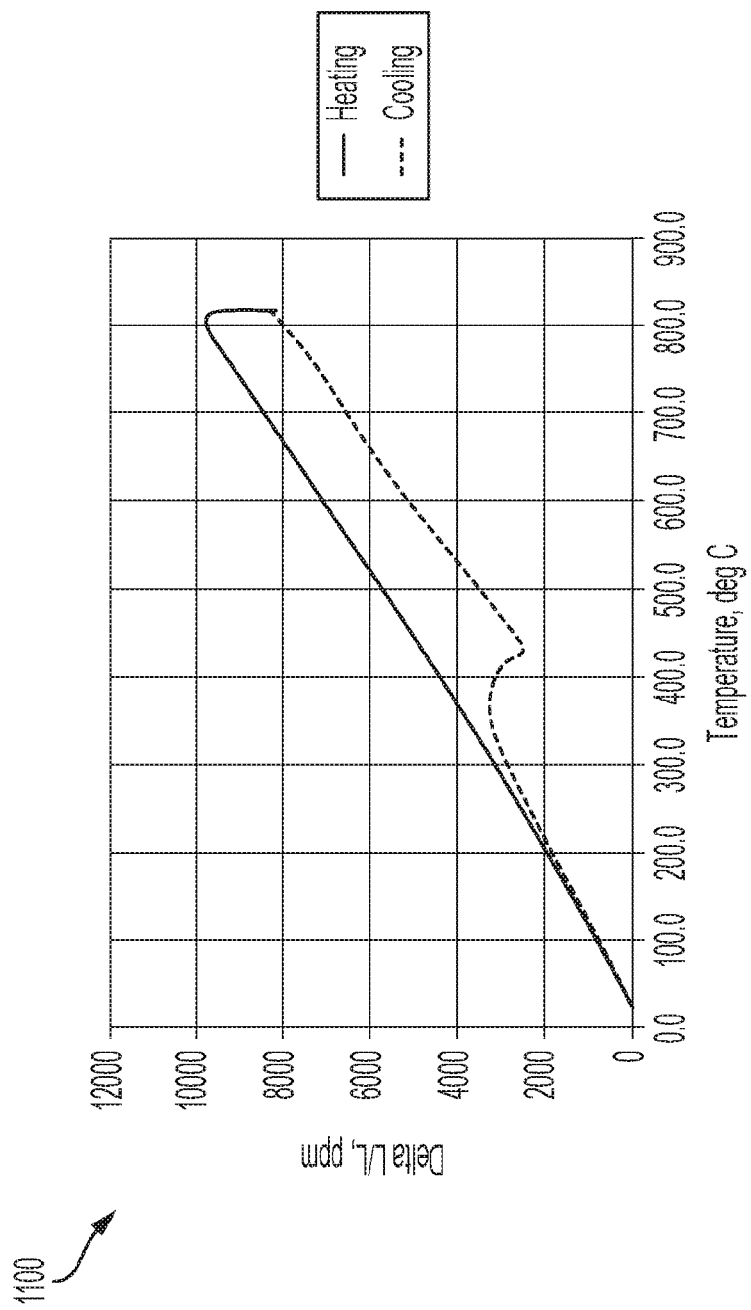
FIG. 10 is graph of the coefficient of thermal expansion across a range of temperatures for a conventional 422 martensitic stainless steel during an exemplary coating process.
Figure 11:
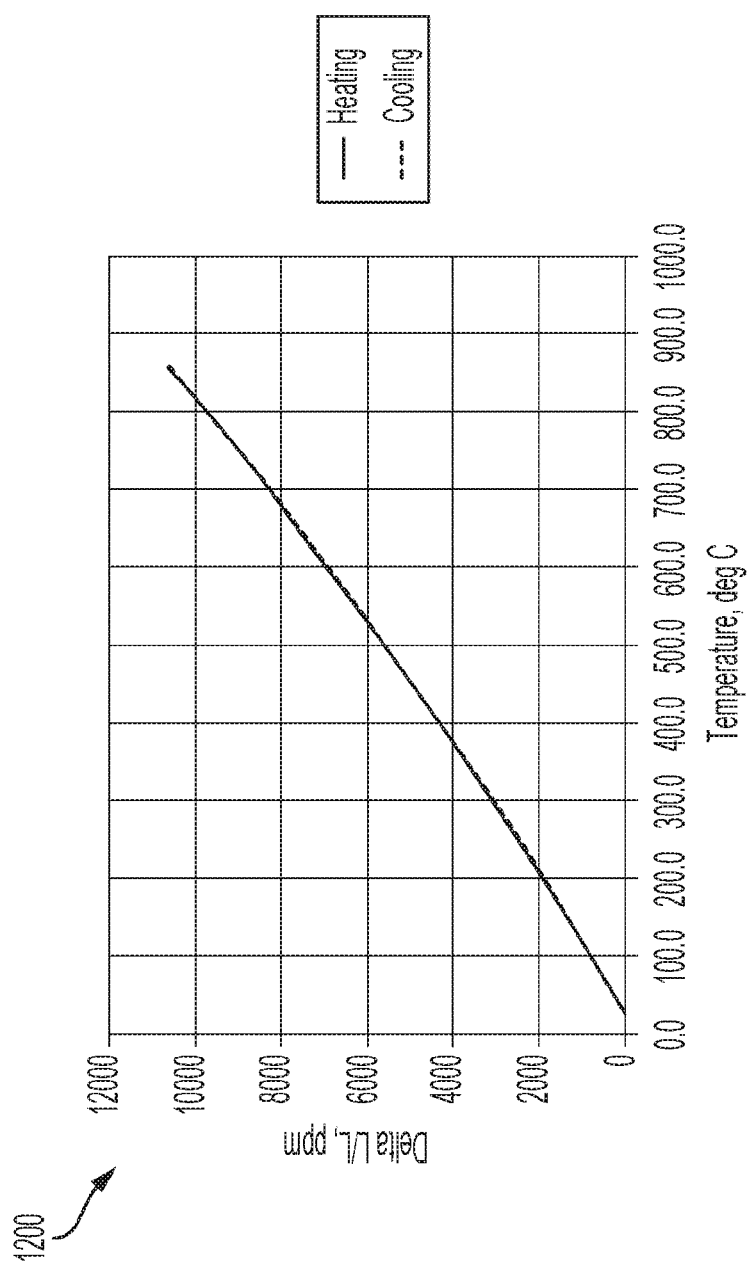
FIG. 11 is graph of the coefficient of thermal expansion across a range of temperatures for a martensitic stainless steel according to some embodiments during an exemplary coating process.

The increased Ac temperature of the modified 422 stainless steel composition of Table 3 is illustrated in FIGS. 10 and 11. Graphs 1100 and 1200 in FIGS. 10 and 11 show the thermal expansion (Delta L/L, ppm) versus temperature for an exemplary deposition process. For the conventional 422 stainless steel composition, the steel thermally expands at a generally linear rate until a temperature of about 805 degrees C., at which the thermal expansion of the steel severely changes due to the onset of austenite transformation within the steel. This severe change reverses as the steel is cooled due to the steel transforming from austenite to martensite upon cooling. In contrast, as shown in graph 1200, the modified 422 stainless steel composition does not experience a change in thermal expansion at a temperature below 850 degrees C. Accordingly, the Ac1 temperature of the modified 422 stainless steel composition is greater than 850 degrees C.

Table 4 below shows high and low weight percentages for a modified martensitic 422 stainless steel material according to some embodiments having an Ac1 temperature above 850 degrees C. Predicted Ac1 temperatures shown in Table 4 are based on empirical calculations using Ac1 temperature data for various steel materials made available through the Cambridge Materials Algorithm project. The data was used to create empirical mathematical models to predict the Ac temperature of a steel based on its alloy content. To confirm the models were producing accurate predictions, the models were used to predict a conventional 422 martensitic stainless steel's Ac temperature. And this prediction was then compared to the actual Ac1 temperature from the conventional 422 stainless steel's CTE curve. As shown in Table 4, the model predicated an Ac1 temperature of 805 degree C., which is consistent with FIG. 10.

TABLE 4

High and low weight percentages for a modified 422 stainless steel (alloy elements in wt %)

| | C | Si | Mn | Ca | Ni | Cr | Mo | V | W | Co | Predicted Ac1 (° C.) |
|---|---|---|---|---|---|---|---|---|---|---|---|
| Conventional | 0.22 | 0.4 | 0.7 | 0.25 | 0.85 | 12 | 1.08 | 0.25 | 1.08 | 0.05 | 805 |
| Modified High Weight % | 0.25 | 1.1 | 0.05 | 0.05 | 0.65 | 14 | 1.5 | 0.65 | 1.3 | 0.1 | 874 |
| Modified Target Weight % | 0.2 | 1 | 0.01 | 0 | 0.5 | 13.5 | 1.25 | 0.5 | 1.25 | 0 | 866 |
| Modified Low Weight % | 0.15 | 0 | 0 | 0 | 0.35 | 13 | 1 | 0.35 | 0.9 | 0 | 852 |

As shown in Table 4, modifying the alloy content can significantly increase the Ac1 temperature for the steel. This allows for high temperature abrasion-resistant coatings to be deposited on a steel substrate with a stable CTE value. The high and low weight percentages shown in Table 4 result in an alloyed steel that retains a machinability and hardenability comparable to a conventional 422 stainless steel.

In some embodiments, a modified steel according to embodiments discussed herein may have a yield strength in the range of 85 kilopounds per square inch (ksi) to 200 kilopounds per square inch, including subranges. For example, the modified steel may have a yield strength of 85 ksi, 90 ksi, 100 ksi, 110 ksi, 120 ksi, 130 ksi, 140 ksi, 150 ksi, 160 ksi, 170 ksi, 180 ksi, 190 ksi, 200 ksi, or within any range having any two of these values as endpoints.

In some embodiments, a modified steel according to embodiments discussed herein may have Rockwell C hardness in the range of 18 to 60. For example, the modified steel may have a Rockwell C hardness of 18, 20, 25, 30, 35, 40, 45, 50, 55, or 60, or within any range having any two of these values as endpoints.

While Tables 3 and 4 show exemplary compositions mechanically similar to 422 stainless steel, other metallic materials having an austenite transformation temperature can be modified to have an increased Ac1 temperature as discussed herein. A further example of this are proposed alloys in comparison to a conventional 17-4 precipitation hardening (PH) alloy as shown below in Table 5.

TABLE 5

Comparison of conventional and modified 17-4 precipitation hardening stainless steels (alloy elements in wt %)

|  | C | Si | Mn | Cu | Ni | Cr | Mo | Predicated Ac1 (° C.) | Actual Ac1 (° C.) |
|---|---|---|---|---|---|---|---|---|---|
| 17-4 Modified 1 | 0.05 | 1 | 0.6 | 1.5 | 4 | 16 | 1 | 754 | Not Tested |
| 17-4 Modified 2 | 0.05 | 1 | 0.6 | 3 | 3 | 17.5 | 1 | 796 | Not Tested |
| Conventional 17-4 | 0.05 | 1 | 1 | 1.5 | 6 | 15 | 0.75 | 689 | 670 |

The modified 17-4 PH steels shown in Table 5 retain the general mechanical and machining characteristics of the conventional 17-4 steel, but have an increased Ac1 temperature like the modified 422 steels of Tables 3 and 4. While the modified 17-4 PH does not show an increased Ac1 temperature as high as that of the modified 422 stainless steel, increasing the Ac temperature of the conventional 17-4 PH steel does allow lower temperature coatings such as Al—Ti—N to be deposited without significant, or any, austenite transformation. Further, it can reduce the amount of austenite transformation for a given deposition process, by increasing the austenite transformation temperature.

In some embodiments, the Ac1 temperature of a modified 17-4 PH steel may be in the range of 725 degrees C. to 875 degrees C., including subranges. For example, a modified 17-4 PH steel may have an Ac1 temperature of 725 degrees C., 750 degrees C., 775 degrees C., 800 degrees C., 825 degrees C., 850 degrees C., or 875 degrees C., or within any range having any two of these values as endpoints.

Figure 12:
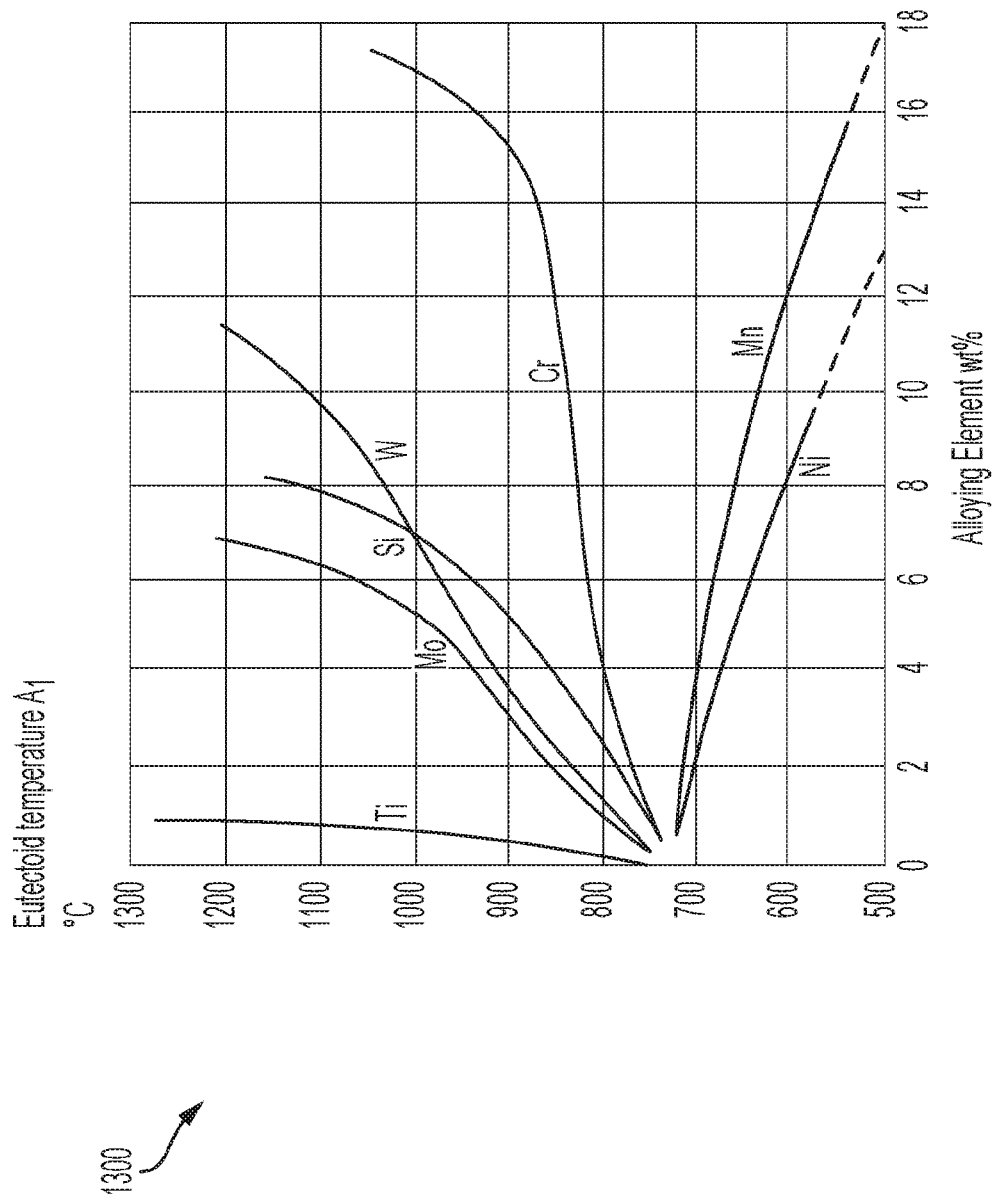
FIG. 12 is a graph showing the impact of various alloying elements on the austenite transformation temperature of a steel.

FIG. 12 shows a graph 1300 of the impact of various alloying elements on the austenite transformation temperature of a steel. As shown in graph 1300, molybdenum (Mo) and manganese (Mn) tend to contribute to the formation of austenite at lower temperatures. But titanium (Ti), molybdenum (Mo), tungsten (W), silicon (Si), and chromium (Cr) tend to reduce or prevent the formation of austenite at lower temperatures. A steeper sloped curve (positive or negative slope) in graph 1300 means the element has a stronger influence on the austenite transformation temperature.

The following are exemplary metal compositions according to embodiments of the present application. In some embodiments, the metal may be a steel comprising iron, molybdenum, and tungsten, and at least one of: manganese, nickel, chromium, and vanadium. In such embodiments, the manganese, nickel, chromium, and vanadium may be present in the following ranges: manganese: less than 0.1 wt %, nickel: less than 0.7 wt %, chromium: more than 12.5 wt %, and vanadium: more than 0.3 wt %.

In some embodiments, the metal may include molybdenum in an amount of 1.0 wt % to 1.5 wt %, including subranges. For example, molybdenum may be present in an amount of 1.0 wt %, 1.1 wt %, 1.2 wt %, 1.3 wt %, 1.4 wt % or, 1.5 wt %, or within any range having any two of these values as endpoints. In some embodiments, a precipitation hardening steel may include molybdenum present in a range between 0.75 wt % and 1.25 wt %, including subranges. For example, molybdenum may be present at 0.75 wt %, 0.8 wt %, 0.9 wt %, 1 wt %, 1.1 wt %, 1.2 wt %, or 1.25 wt %, or within any range having any two of these values as endpoints.

In some embodiments, the metal may include tungsten in an amount of 0.9 wt % to 1.3 wt %, including subranges. For example, tungsten may be present in an amount of 0.9 wt %, 1.0 wt %, 1.1 wt %, 1.2 wt %, or 1.3 wt %, or within any range having any two of these values as endpoints.

In some embodiments, the metal may include manganese in an amount less than 0.1 wt %. For example, the metal may include manganese at 0.09 wt %, 0.08 wt %, 0.07 wt %, 0.06 wt %, 0.05 wt %, 0.04 wt %, 0.03 wt %, 0.02 wt %, 0.01 wt %, or 0 wt %, or within any range having any two of these values as endpoints. In some embodiments, the metal may include manganese present at less than 0.05 wt %. In some embodiments, a precipitation hardening steel may include manganese present in a range between 0.1 wt % and 0.9 wt %, including subranges. For example, manganese may be present at 0.1 wt %, 0.2 wt %, 0.3 wt %, 0.4 wt %, 0.5 wt %, 0.6 wt %, 0.7 wt %, 0.8 wt %, or 0.9 wt %, or within any range having any two of these values as endpoints.

In some embodiments, the metal may include nickel present at less than 0.7 wt %. For example, the metal may include nickel at 0.65 wt %, 0.6 wt %, 0.55 wt %, 0.5 wt %, 0.45 wt %, 0.4 wt %, 0.35 wt %, 0.3 wt %, 0.25 wt %, 0.2 wt %, 0.15 wt %, 0.1 wt %, 0.05 wt %, or 0 wt %, or within any range having any two of these values as endpoints. In some embodiments, a precipitation hardening steel may include nickel present in a range between 3 wt % and 4 wt %, including subranges. For example, nickel may be present at 3 wt %, 3.2 wt %, 3.4 wt %, 3.5 wt %, 3.6 wt %, 3.8 wt %, or 4 wt %, or within any range having any two of these values as endpoints.

In some embodiments, the metal may include chromium present at 12.5 wt % or more. For example, the metal may include chromium present at 13 wt %, 14 wt %, 15 wt %, 16 wt %, 17 wt %/o, or 18 wt %, or within an range having any two of these values as endpoints. In some embodiments, a precipitation hardening steel may include chromium present in a range between 16 wt % and 19 wt %, including subranges. For example, chromium may be present at 16 wt %, 16.5 wt %, 17 wt %, 17.5 wt %, 18 wt %, 18.5 wt %, or 19 wt %, or within any range having any two of these values as endpoints.

Vanadium, like titanium, molybdenum, tungsten, silicon, and chromium, tends to reduce or prevent the formation of austenite at lower temperatures. In some embodiments, the metal may include vanadium present at more than 0.3 wt %. For example, the metal may include vanadium present at 0.35 wt %, 0.4 wt %, 0.45 wt %, 0.5 wt %, 0.55 wt %, 0.6 wt %, 0.65 wt %, 0.7 wt %, 0.75 wt %, 0.8 wt %, 0.85 wt %, 0.9 wt %, 0.95 wt %, or 1 wt %, or within any range having any two of these values as endpoints.

Copper, like titanium, molybdenum, tungsten, silicon, and chromium, tends to reduce or prevent the formation of austenite at lower temperatures. In some embodiments, the metal may include copper present in a range between 0 wt % and 0.05 wt %, including subranges. For example, copper may be present at 0 wt %, 0.01 wt %, 0.02 wt %, 0.03 wt %, 0.04 wt %, or 0.05 wt %, or within any range having any two of these values as endpoints. In some embodiments, the metal may not include copper. In some embodiments, a precipitation hardening steel may include copper present in a range between 1.5 wt % and 3 wt %, including subranges. For example, copper may be present at 1.5 wt %, 1.75 wt %, 2 wt %, 2.25 wt %, 2.5 wt %, 2.75 wt %, or 3 wt %, or within any range having any two of these values as endpoints.

Cobalt, like titanium, molybdenum, tungsten, silicon, and chromium, tends to reduce or prevent the formation of austenite at lower temperatures. In some embodiments, the metal may include cobalt present in a range between 0 wt % and 0.1 wt %, including subranges. For example, cobalt may be present at 0 wt %, 0.01 wt %, 0.02 wt %, 0.03 wt %, 0.04 wt %, 0.05 wt %, 0.06 wt %, 0.07 wt %, 0.08 wt %, 0.09 wt %, or 0.1 wt %, or within any range having any two of these values as endpoints. In some embodiments, the metal may not include cobalt.

Silicon, like titanium, molybdenum, tungsten, silicon, and chromium, tends to reduce or prevent the formation of austenite at lower temperatures. In some embodiments, the metal may include silicon present in a range between 0 wt % and 1.1 wt %, including subranges. For example, silicon may be present at 0 wt %, 0.1 wt %, 0.2 wt %, 0.3 wt %, 0.4 wt %, 0.5 wt %, 0.6 wt %, 0.7 wt %, 0.8 wt %, 0.9 wt %, 1 wt %, or 1.1 wt %, or within any range having any two of these values as endpoints. In some embodiments, a precipitation hardening steel may include silicon present in a range between 0.75 wt % and 1.25 wt %, including subranges. For example, silicon may be present at 0.75 wt %, 0.8 wt %/o, 0.9 wt %, 1 wt %, 1.1 wt %, 1.2 wt %, or 1.25 wt %, or within any range having any two of these values as endpoints.

Niobium, like titanium, molybdenum, tungsten, silicon, and chromium, tends to reduce or prevent the formation of austenite at lower temperatures. In some embodiments, the metal may include niobium present in a range between 0.75 wt % and 1.25 wt %, including subranges. For example, niobium may be present at 0.75 wt %, 0.8 wt %, 0.85 wt %, 0.9 wt %, 0.95 wt %, 1 wt %, 1.05 wt %, 1.1 wt %, 1.15 wt %, 1.2 wt %, or 1.25 wt %, or within any range having any two of these values as endpoints.

Carbon, like molybdenum and manganese, tends to contribute to the formation of austenite at lower temperatures. In some embodiments, the metal may include carbon present in a range between 0.15 wt % and 0.25 wt %, including subranges. For example, carbon may be present at 0.15 wt %, 0.16 wt %, 0.17 wt %, 0.18 wt %, 0.19 wt %, 0.2 wt %, 0.21 wt %, 0.22 wt %, 0.23 wt %, 0.24 wt %, or 0.25 wt %, or within any range having any two of these values as endpoints. In some embodiments, carbon may be present in a range of 0.15 wt %, 0.2 wt %. In some embodiments, a precipitation hardening steel may include carbon present in a range between 0.025 wt % and 0.075 wt %, including subranges. For example, carbon may be present at 0.025 wt %, 0.03 wt %, 0.04 wt %, 0.05 wt %, 0.06 wt %, 0.07 wt %, or 0.075 wt %, or within any range having any two of these values as endpoints.

In some embodiments, the metal may be a steel including iron, molybdenum, and tungsten, and also including manganese, nickel, chromium, and vanadium in the following ranges: manganese: 0 wt % to 0.05 wt %, nickel: 0.35 wt % to 0.65 wt %, chromium: 13 wt % to 14 wt %, and vanadium: 0.35 wt % to 0.65 wt %.

In some embodiments, the metal may be a steel including iron, molybdenum, and tungsten, and also including manganese, cooper, nickel, chromium, molybdenum, and vanadium in the following ranges: manganese: 0 wt % to 0.05 wt %, copper: 0 wt % to 0.05 wt %, nickel: 0.35 wt % to 0.65 wt %, chromium: 13 wt %6 to 14 wt %, molybdenum: 1.0 wt % to 1.5 wt %, and vanadium: 0.35 wt % to 0.65 wt %.

In some embodiments, the metal may be a steel including iron, molybdenum, and tungsten and also including manganese, cooper, nickel, chromium, molybdenum, vanadium, tungsten, and cobalt in the following ranges: manganese: 0 wt % to 0.05 wt %, copper: 0 wt % to 0.05 wt %, nickel: 0.35 wt % to 0.65 wt %, chromium: 13 wt % to 14 wt %, molybdenum: 1.0 wt % to 1.5 wt %, vanadium: 0.35 wt % to 0.65 wt %, tungsten: 0.9 wt % to 1.3 wt %, and cobalt: 0 wt % to 0.1 wt %.

In some embodiments, the metal may be a steel including iron, molybdenum, and tungsten, and also including manganese, cooper, nickel, chromium, molybdenum, vanadium, tungsten, cobalt, and carbon in the following ranges: manganese: 0 wt % to 0.05 wt %, copper: 0 wt % to 0.05 wt %, nickel: 0.35 wt % to 0.65 wt %, chromium: 13 wt % to 14 wt %, molybdenum: 1.0 wt % to 1.5 wt %, vanadium: 0.35 wt % to 0.65 wt %, tungsten: 0.9 wt % to 1.3 wt %, cobalt: 0 wt % to 0.1 wt %, and carbon: 0.15 wt % to 0.25 wt %.

In some embodiments, the metal may be a martensitic stainless steel including iron and at least five of: carbon, silicon, manganese, copper, nickel, chromium, molybdenum, vanadium, tungsten, and cobalt in the following ranges: carbon: 0.15 wt % to 0.25 wt %/o, silicon: 0 wt % to 1.1 wt %, manganese: 0 wt % to 0.05 wt %/o, copper: 0 wt % to 0.05 wt %, nickel: 0.35 wt % to 0.65 wt %, chromium: 13 wt % to 14 wt %, molybdenum: 1.0 wt % to 1.5 wt %, vanadium: 0.35 wt % to 0.65 wt %, tungsten: 0.9 wt % to 1.3 wt %, and cobalt: 0 wt % to 0.1 wt %. In some embodiments, the metal may be a martensitic stainless steel including iron and at least six of: carbon, silicon, manganese, copper, nickel, chromium, molybdenum, vanadium, tungsten, and cobalt in the above ranges. In some embodiments, the metal may be a martensitic stainless steel including iron and at least seven of: carbon, silicon, manganese, copper, nickel, chromium, molybdenum, vanadium, tungsten, and cobalt in the above ranges.

In some embodiments, iron may be present in a range between 70 wt % and 85 wt %, including subranges. For example, iron may be present at 70 wt %, 72.5 wt %, 75 wt %, 77.5 wt %, 80 wt %, 82.5 wt %, or 85 wt %, or within any range having any two of these values as endpoints.

Any of the above described steels may be formed into a metal body for a metal article, which may be coated with inorganic particles as discussed herein. For example, any of the above described steels may be formed into an extrusion die or portion thereof (e.g., extrusion die 100 or a portion thereof), a cutting tool, or a grinding tool, which may be coated with inorganic particles as discussed herein. The inorganic particles may be disposed onto a surface of the metal body to form an abrasion-resistant coating onto the surface of the metal body.

In some embodiments, a modified steel according to embodiments discussed herein may have a coefficient of thermal expansion measured at 849 degrees C. and the abrasion-resistant coating may have a coefficient of thermal expansion measured at 849 degrees C., and the delta CTE of the modified steel and the abrasion-resistant coating is $10 \times 10^{-6}$/degrees C. or less.

In some embodiments, modified steels according to embodiments discussed herein may be formed into a metal body through the use of powder metallurgy and its associated processing. In such embodiments, the metallic material of the modified steels includes consolidated metallic powders. In some embodiments, the power metallurgy formulation and processing may be the same as or similar to the formation and processing discussed in U.S. Pat. No. 6,302,679, which is hereby incorporated by reference in its entirety.

For example, in some embodiments, forming a metal body may include mixing and consolidating iron power, molybdenum power, and tungsten power, and at least one of the following: manganese power, nickel power, chromium powder, and vanadium powder. And, in some embodiments, the manganese powder, nickel powder, chromium powder, and vanadium powder may be in the following ranges: manganese: less than 0.1 wt %, nickel: less than 0.7 wt %, chromium: more than 12.5 wt %, and vanadium: more than 0.3 wt %. Other alloy compositions may be formed into a metal body in the same fashion.

Low Temperature Deposition Methods for TiCN and/or Boron-Doped TiCN Particles

In some embodiments, the source gases for a TiCN and/or boron-doped TiCN (B—TiCN) inorganic particle deposition process may be tailored to deposit the inorganic particles at a temperature at or below the Ac1 temperature of a metal substrate. For example, source gases 930 introduced into deposition chamber 900 for the formation of TiCN and/or boron-doped TiCN inorganic particles 920 may be tailored to reduce the temperature required for formation of inorganic particles 920 to at or below the Ac1 temperature of a metallic material of metal substrate 910. In some embodiments, the metallic material may be conventional metal alloy. In some embodiments, the metallic material may be a modified metal alloy according to embodiments discussed herein.

Reducing the deposition temperature required for depositing TiCN and/or B—TiCN particles may be achieved using at least one of the following methods. In some embodiments, a combination of one or more of the following methods may be utilized. First, a deposition method including a single source gas for carbon and nitrogen with a heat of formation energy that is less than 65.9 kilojoules per mole. Second, a deposition method including two source gases, one for carbon that includes a gas molecule having a carbon-nitrogen single bond and one for nitrogen. Third, a deposition method including a source gas including an metalorganic compound to form inorganic particles. Fourth, a deposition method including two or more sources gases that react to form inorganic particles and an aluminum-containing metalorganic reducing agent.

In the first method, a single source gas for carbon and nitrogen with a heat of formation energy that is less than 65.9 kilojoules per mole is utilized to reduce the temperature required for the formation of TiCN and/or B—TiCN particles in deposition chamber 900. Acetonitrile ($CH_3CN$) has been used in conventional TiCN and/or B—TiCN deposition processes as a source gas for both carbon and nitrogen. Acetonitrile has a heat of formation energy that is 65.9 kilojoules per mole. By utilizing a suitable carbon and nitrogen source gas having a lower heat of formation, TiCN and/or B—TiCN can be formed at lower temperatures. In some embodiments, the single source gas for carbon and nitrogen may include a gas molecule having a carbon chain of four or more carbon atoms. In this first method, the single source gas for carbon and nitrogen may be the only source for these elements in the deposited TiCN and/or B—TiCN particles. Additional sources of carbon and nitrogen may not be present.

In this first method, a titanium source gas is required for the formation of TiCN or B—TiCN particles. In some embodiments, the titanium source gas may be titanium tetrachloride ($TiCl_4$). In some embodiments, the titanium source gas may be a metalorganic compound. Suitable metalorganic compounds include those discussed herein, such as tetrakis(dimethylamido) titanium (TDMAT).

Suitable carbon and nitrogen source gases with a heat of formation energy that is less than 65.9 kilojoules per mole include nitriles, such as but not limited to, trichloroacetonitrile ($CCl_3CN$), propionitrile ($CH_3CH_2CN$), acrylonitrile, isobutyronitrile, benzonitrile, butyronitrile, trans 2-butyronitrile, 3-butenenitrile, succinonitrile, cyclobutanecarbonitrile, cyclohexanecarbonitrile, 1-cyclohexenecarbonitrile, cyclopentanecarbonitrile, 1-cyclopentenecarbonitrile, cyclopropanecarbonitrile, octanenitrile, 2,2-dimethylpropanenitrile, heptanenitrile, adiponitrile, malononitrile, methacrylonitrile, 2-methylpropanenitrile, trans-3-pentenenitrile. Suitable nitriles may include the base formula of A-CN, where A is alkyl, alkenyl, cycloalkanyl, cycloalkenyl, any of which is optionally substituted with one or more chloro groups.

In embodiments of this first method including the deposition of B—TiCN particles, one or more boron-containing source gases is introduced into chamber 900. The boron-containing source gas(es) may be borane, diborane, boron trichloride, trimethylamine borane (($CH_3)_3NBH_3$) (TMAB), or a combination thereof.

In the second method, separate source gases for carbon and nitrogen are utilized to reduce the temperature required for the formation of TiCN and/or B—TiCN particles in deposition chamber 900. In embodiments according to this second method, at least two source gases are utilized, one that is a source for at least carbon and one that is a source for at least nitrogen. In some embodiments, the source for nitrogen may also be a source of carbon. In some embodiments, the source for nitrogen may not be a source for carbon. In some embodiments, the source for nitrogen may be ammonia ($HN_3$).

In methods according to embodiments of this second method, the source for carbon includes a gas molecule having a carbon-nitrogen single bond. By utilizing a suitable gas molecule having a carbon-nitrogen single bond, TiCN and/or B—TiCN can be formed at lower temperatures than conventional deposition processes.

Suitable carbon sources for this second method include amines, such as but not limited to dialkyl and trialkyl amines. Suitable dialkyl and trialkyl amines include, but are not limited to, trimethylamine $((CH_3)_3N)$, dimethylamine, dimethyl amine hydrochloride, and trimethylamine. In some embodiments, the amine may be trimethylamine borane $((CH_3)_3NBH_3)(TMAB)$, which may also be utilized as the source for boron when depositing B—TiCN particles.

In this second method, a titanium source gas is required for the formation of TiCN and/or B—TiCN particles. In some embodiments, the titanium source gas may be titanium tetrachloride $(TiCl_4)$. In some embodiments, the titanium source gas may be a metalorganic compound. Suitable metalorganic compounds include those discussed herein, such as tetrakis(dimethylamido) titanium (TDMAT).

In embodiments of this second method including the deposition of B—TiCN particles, one or more boron-containing source gases is introduced into chamber 900. The boron-containing source gas(es) may be borane, diborane, boron trichloride, trimethylamine borane $((CH_3)_3NBH_3)$ (TMAB), or a combination thereof.

In the third method, a source gas including a metalorganic compound that is the source for carbon, nitrogen, and titanium in deposited TiCN and/or B—TiCN particles is used. Suitable metalorganic compounds include, but are not limited to, tetrakis(dimethylamido) titanium, tetrakis(ethylmethylamino) titanium, tetrakis(diethylamido)titanium (TDEAT), tetrakis (methylethylamindo) titanium (TMEAT), and a metal organic compounds with Ti—N bonds.

In embodiments of this third method including the deposition of B—TiCN particles, one or more boron-containing source gases is introduced into chamber 900. The boron-containing source gas(es) may be borane, diborane, boron trichloride, trimethylamine borane $((CH_3)_3NBH_3)$ (TMAB), or a combination thereof.

In the fourth method, two more source gases that react to form TiCN and/or B—TiCN particles are introduced into deposition chamber 900 along with an aluminum-containing metalorganic reducing agent. The aluminum-containing metalorganic reducing agent is utilized to reduce the temperature required for the formation of TiCN and/or B—TiCN in deposition chamber 900. The aluminum-containing metalorganic reducing agent reduces the temperature required for the formation of TiCN and/or B—TiCN by reducing Cl in $TiCl_4$ gas. The two or more source gases that react to form TiCN or B—TiCN in embodiments according to this fourth method include $TiCl_4$ plus any of the carbon and/or nitrogen source gases discussed herein, as well as conventional source gases such as acetonitrile.

In some embodiments, the aluminum-containing metalorganic reducing agent may include a trialkyl aluminum metalorganic compound. In some embodiments, the aluminum-containing metalorganic reducing agent may include a trimethylaluminum, triethylaluminum, a trisobutylaluminum, and/or an alane aluminum hydride. Suitable alane aluminum hydrides include, but are not limited to, dimethyl aluminum hydride, dimethyl aluminum hydride, and dimethylethylamine alane.

In methods according to embodiments of the fourth method, the amount of aluminum-containing metalorganic reducing agent may be limited such that the composition of deposited TiCN and/or B—TiCN particles includes a limited amount of aluminum. For example, the amount of aluminum-containing metalorganic reducing agent may be limited such that deposited TiCN and/or B—TiCN particles include 30 mol % or less aluminum. In some embodiments, deposited TiCN and/or B—TiCN particles may include 1 mol % to 30 mol % aluminum, including subranges. For example, deposited TiCN and/or B—TiCN particles may include 1 mol % aluminum, 5 mol % aluminum, 10 mol % aluminum, 15 mol % aluminum, 20 mol % aluminum, 25 mol % aluminum, or 30 mol % aluminum, or a mole percent of aluminum within a range having any two of these values as endpoints.

Any of the four methods discussed above, or a combination of one or more of these methods, may deposit TiCN and/or B—TiCN particles at a deposition temperature of 900 degrees C. or less. In some embodiments, the method(s) may deposit TiCN and/or B—TiCN particles at a deposition temperature in the range of 400 degrees C. to 900 degrees C., including subranges. For example, the deposition temperature may be 400 degrees C., 450 degrees C., 500 degrees C., 550 degrees C., 600 degrees C., 650 degrees C., 700 degrees C., 750 degrees C., 800 degrees C., 850 degrees C., or 900 degrees C., or within any range having any two of these values as endpoints. In some embodiments, the deposition temperature may be in the range of 400 degrees C. to 750 degrees C. In some embodiments, the deposition temperature may be in the range of 600 degrees C. to 750 degrees C. In some embodiments, the deposition temperature may be in the range of 400 degrees C. to 600 degrees C.

In some embodiments, metal substrate 910 may be kept at a temperature below 900 degrees C. during a deposition process of TiCN and/or B—TiCN particles according to any of these methods, or a combination thereof. For example, in some embodiments, the deposition temperature for deposition of TiCN and/or B—TiCN particles may be in the range of 600 degrees C. to 750 degrees C. and metal substrate may be kept at a temperature below 900 degrees C. during the deposition process. In some embodiments, metal substrate 910 may be kept at a temperature in the range of 600 degrees C. to 900 degrees C. during the deposition process, including subranges. For example, metal substrate 910 may be kept at a temperature of 600 degrees C., 650 degrees C., 700 degrees C., 750 degrees C., 800 degrees C., 850 degrees C., or 900 degrees C., or within any range having any two of these values as endpoints.

Further, any of the four methods discussed above, or a combination of one or more of these methods, may form an abrasion-resistant coating (e.g., coating 1020) with any number of individual layers of TiCN or B—TiCN as discussed herein. The thickness of an abrasion-resistant coating formed by any of these methods, or a combination thereof, may be the same as any thickness or thickness range for thickness 1022 discussed herein. Also, the thickness of individual layers of TiCN or B—TiCN may be the same as any thickness or thickness range for thickness 1032 discussed herein.

While various embodiments have been described herein, they have been presented by way of example, and not limitation. It should be apparent that adaptations and modifications are intended to be within the meaning and range of equivalents of the disclosed embodiments, based on the teaching and guidance presented herein. It therefore will be apparent to one skilled in the art that various changes in form and detail can be made to the embodiments disclosed herein without departing from the spirit and scope of the present disclosure. The elements of the embodiments presented herein are not necessarily mutually exclusive, but may be interchanged to meet various situations as would be appreciated by one of skill in the art.

Embodiments of the present disclosure are described in detail herein with reference to embodiments thereof as illustrated in the accompanying drawings, in which like reference numerals are used to indicate identical or functionally similar elements. References to "one embodiment," "an embodiment," "some embodiments," "in certain embodiments," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The examples are illustrative, but not limiting, of the present disclosure. Other suitable modifications and adaptations of the variety of conditions and parameters normally encountered in the field, and which would be apparent to those skilled in the art, are within the spirit and scope of the disclosure.

The term "or," as used herein, is inclusive; more specifically, the phrase "A or B" means "A, B, or both A and B."

The indefinite articles "a" and "an" to describe an element or component means that one or at least one of these elements or components is present. Although these articles are conventionally employed to signify that the modified noun is a singular noun, as used herein the articles "a" and "an" also include the plural, unless otherwise stated in specific instances. Similarly, the definite article "the," as used herein, also signifies that the modified noun may be singular or plural, again unless otherwise stated in specific instances.

Where a range of numerical values is recited herein, comprising upper and lower values, unless otherwise stated in specific circumstances, the range is intended to include the endpoints thereof, and all integers and fractions within the range. It is not intended that the scope of the claims be limited to the specific values recited when defining a range. Further, when an amount, concentration, or other value or parameter is given as a range, one or more preferred ranges or a list of upper preferable values and lower preferable values, this is to be understood as specifically disclosing all ranges formed from any pair of any upper range limit or preferred value and any lower range limit or preferred value, regardless of whether such pairs are separately disclosed. Finally, when the term "about" is used in describing a value or an end-point of a range, the disclosure should be understood to include the specific value or end-point referred to. Whether or not a numerical value or end-point of a range recites "about," the numerical value or end-point of a range is intended to include two embodiments: one modified by "about," and one not modified by "about."

As used herein, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art.

The terms "substantial," "substantially," and variations thereof as used herein are intended to note that a described feature is equal or approximately equal to a value or description. For example, a "substantially planar" surface is intended to denote a surface that is planar or approximately planar. Moreover, "substantially" is intended to denote that two values are equal or approximately equal.

The present embodiment(s) have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

It is to be understood that the phraseology or terminology used herein is for the purpose of description and not of limitation. The breadth and scope of the present disclosure should not be limited by any of the above-described exemplary embodiments, but should be defined in accordance with the following claims and their equivalents.

What is claimed is:

1. A method of applying an inorganic material to a metal substrate that comprises a metallic material that undergoes transformation to an austenitic phase at an austenite transformation temperature, the method comprising:
   depositing inorganic particles onto a surface of the metal substrate at a deposition temperature that does not cause the metallic material to exceed the austenite transformation temperature of the metallic material, and
   depositing additional inorganic particles onto the inorganic particles in one or more additional deposition processes to form a multi-layer abrasion-resistant coating comprising a boron-doped titanium carbonitride layer and a titanium carbonitride layer,
   wherein a deposition temperature of the one or more additional deposition processes does not cause the metallic material to exceed the austenite transformation temperature of the metallic material.

2. The method of claim 1, wherein the inorganic particles are deposited by a vapor deposition process.

3. The method of claim 1, wherein the inorganic particles comprise at least one of: titanium carbonitride, boron, boron-doped titanium carbonitride, aluminum titanium nitride, titanium aluminum nitride, chromium nitride, titanium nitride, and a combination thereof.

4. The method of claim 1, wherein the inorganic particles deposited onto the surface of the metal substrate are deposited in a first deposition process,
   wherein the method further comprises a second deposition process that deposits additional inorganic particles onto the inorganic particles deposited in the first deposition process, and wherein the second deposition process comprises a deposition temperature that does not exceed the austenite transformation temperature of the metallic material of the metal substrate.

5. The method of claim 4, wherein the additional inorganic particles are different from the inorganic particles deposited in the first deposition process.

6. The method of claim 1, wherein the multi-layer coating further comprises a titanium nitride layer.

7. The method of claim 1, wherein an outermost layer of the multi-layer coating comprises boron-doped titanium carbonitride.

8. The method of claim 1, wherein the deposition temperature is in the range of 600 degrees C. to 860 degrees C.

9. The method of claim 1, wherein the metallic material is a steel.

10. The method of claim 1, wherein the metallic material is a martensitic steel.

11. The method of claim 1, wherein the inorganic particles form an abrasion-resistant coating on the surface of the metal substrate, wherein the metallic material comprises a steel having a first coefficient of thermal expansion measured at T degrees C. after deposition of the abrasion-resistant coating and the abrasion-resistant coating comprises a second coefficient of thermal expansion measured at T degrees C. after deposition of the abrasion-resistant coating, wherein T is equal to one degree C. greater than a temperature at which the steel starts to transform to martensite during cooling after deposition of the abrasion-resistant coating, and wherein the difference between the first coefficient of thermal expansion of the metallic material and the second coefficient of thermal expansion of the abrasion-resistant coating is $10 \times 10^{-6}$/degrees C. or less.

12. The method of claim 11, wherein the difference between the first coefficient of thermal expansion of the metallic material and the second coefficient of thermal expansion of the abrasion-resistant coating is in the range of $10 \times 10^{-7}$/degrees C., to $10 \times 10^{-6}$/degrees C.

13. The method of claim 11, wherein the method further comprises depositing additional inorganic particles onto the abrasion-resistant coating in one or more additional deposition processes to form a multi-layer abrasion-resistant coating, wherein a deposition temperature of the one or more additional depositions processes does not exceed the austenite transformation temperature of the metallic material of the metal substrate, wherein the multi-layer abrasion-resistant coating comprises a boron-doped titanium carbonitride layer, and wherein the coefficient of thermal expansion of the multi-layer abrasion-resistant coating is defined by a sum of a fractional coefficient of thermal expansion for each layer of the multi-layer coating, and wherein the fractional coefficient of thermal expansion for each layer is calculated with the following equation:

$$fCTE = (Tl/Tt) * CTEl,$$

where:
fCTE=the fractional coefficient of thermal expansion for a respective layer,
Tl=the thickness of a respective layer,
Tt=the total thickness of the multilayer coating, and
CTEl=the coefficient of thermal expansion for a respective layer.

14. The method of claim 1, wherein the metal substrate comprises an extruder component.

15. A method of applying an inorganic material to a metal substrate that comprises a metallic material that undergoes transformation to an austenitic phase at an austenite transformation temperature, the method comprising:

depositing inorganic particles onto a surface of the metal substrate at a deposition temperature that does not cause the metallic material to exceed the austenite transformation temperature of the metallic material;

further comprising, prior to deposition of inorganic particles, depositing a layer of titanium nitride on the surface of the metal substrate at a first temperature above the austenite transformation temperature of the metallic material of the metal substrate, and cooling the layer of titanium nitride and the metal substrate to a second temperature below the martensite transformation temperature of the metallic material such that austenite formed in the metallic material during deposition of the layer of titanium nitride is transformed to martensite.

16. The method of claim 15, wherein the second temperature is in the range of 100 degrees C. to 400 degrees C.

* * * * *